United States Patent
Shuler et al.

(10) Patent No.: US 9,904,747 B2
(45) Date of Patent: Feb. 27, 2018

(54) AGRICULTURAL TERRAIN FORMING BASED ON SOIL MODELING

(71) Applicant: Trimble Navigation Limited, Sunnyvale, CA (US)

(72) Inventors: Joshua W. Shuler, Fort Collins, CO (US); Christopher van der Loo, Erie, CO (US)

(73) Assignee: Trimble Inc., Sunnyvale, CA (US)

( * ) Notice: Subject to any disclaimer, the term of this patent is extended or adjusted under 35 U.S.C. 154(b) by 392 days.

(21) Appl. No.: 14/663,273

(22) Filed: Mar. 19, 2015

(65) Prior Publication Data

US 2016/0275218 A1    Sep. 22, 2016

(51) Int. Cl.
| | | |
|---|---|---|
| G06G 7/48 | (2006.01) | |
| G06F 17/50 | (2006.01) | |
| G06T 17/05 | (2011.01) | |
| G06Q 50/02 | (2012.01) | |

(52) U.S. Cl.
CPC ......... *G06F 17/5009* (2013.01); *G06Q 50/02* (2013.01); *G06T 17/05* (2013.01)

(58) Field of Classification Search
CPC ...... G06F 17/5009; G06Q 50/02; G06T 17/05
USPC .......................................................... 703/6
See application file for complete search history.

(56) References Cited

U.S. PATENT DOCUMENTS

| | | | |
|---|---|---|---|
| 6,597,992 B2 | 6/2003 | Rooney et al. | |
| 6,959,245 B2 | 10/2005 | Rooney et al. | |
| 7,254,485 B2 | 8/2007 | Rooney et al. | |
| 7,870,684 B2 * | 1/2011 | Cox | E02F 9/262 37/348 |
| 9,242,669 B2 | 1/2016 | Shuler | |
| 2003/0083819 A1 * | 5/2003 | Rooney | G01V 11/00 702/5 |
| 2012/0101861 A1 * | 4/2012 | Lindores | G06Q 10/06 705/7.11 |
| 2016/0057920 A1 | 3/2016 | Spiller et al. | |
| 2016/0275211 A1 | 9/2016 | Shuler et al. | |

FOREIGN PATENT DOCUMENTS

WO    WO 2016/032901 A1    3/2016

* cited by examiner

*Primary Examiner* — Andre Pierre Louis
(74) *Attorney, Agent, or Firm* — Swanson & Bratschun, L.L.C.

(57) ABSTRACT

Novel tools and techniques might provide for implementing mass haul optimization for agricultural terrain forming, based at least in part on three-dimensional soil modeling. In some embodiments, a computer system might determine desired soil conditions (including minimum topsoil depth, maximum and minimum slope, etc.) for an agricultural area. The computer system might also identify, based on 3-D topographical surveys and 3-D soil profiles, deficient locations within the agricultural area that do not possess at least the minimum topsoil depth, excess locations that possess greater than the minimum topsoil depth, sloped locations that exceed the maximum slope, and/or flat locations whose slopes are less than the minimum slope. Costs and volumes of topsoil and/or subsurface material may be calculated, and based on such calculations it may be determined how much topsoil and/or subsurface material to relocate or order to achieve the desired topsoil depth and slope at the identified locations.

20 Claims, 9 Drawing Sheets

AGRICULTURAL TERRAIN FORMING BASED ON SOIL MODELING

CROSS-REFERENCES TO RELATED APPLICATIONS

This application may be related to U.S. patent application Ser. No. 14/225,550 (the "'550 application"), filed on Apr. 17, 2014 by Joshua W. Shuler, entitled, "Rudder-Assisted Steering For Self-Propelled Drainage Equipment," U.S. patent application Ser. No. 14/469,790 (the "'790 application"), filed on Aug. 27, 2014 by Stephanie A. Spiller et al., entitled, "Three-Dimensional Elevation Modeling For Use In Operating Agricultural Vehicles," and U.S. patent application Ser. No. 14/663,291, filed on a date even herewith by Joshua W. Shuler et al., entitled, "Agricultural Drainage Design Based on Soil Modeling."

The respective disclosures of these applications/patents (which this document refers to collectively as the "Related Applications") are incorporated herein by reference in their entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and computer software for implementing mass haul optimization, and, in particular embodiments, to methods, systems, and computer software for implementing mass haul optimization for agricultural terrain forming, based at least in part on three-dimensional soil modeling.

BACKGROUND

In the field of agriculture, the cost of leveling, and the availability of land conducive to leveling, are enormously expensive and increasingly rare. Farmers are being forced to increase the quality and volume of crops produced on this limited land area as well as to find innovative ways to economically open up new tracts of land and make them produce the desired crops.

These new tracts of land add new challenges as they are not cost-effective to level and require new techniques for optimizing their productivity. Farmers are now using land-forming technologies customized for agriculture to optimize their field topography to meet the requirements of proper drainage and even irrigation coverage without compromising the thickness of topsoil across the field. Removing too much topsoil decreases the ultimate fertility of the soil and results in very poor crop performance in many of the affected areas.

Although topographical surveys and/or soil profiles (in some cases, 3-D topographical surveys and/or 3-D soil profiles) are performed on land, such as farm land, such techniques have not been integrated in a consolidated system that takes such data into account to identify particular portions of the agricultural area that have particular depths of topsoil, deficiencies in topsoil depths, particular slopes, and/or the like, to determine courses of action to take to achieve desired depths of topsoil and/or desired slope using a computer system that is part of the consolidated system, and to implement the determined courses of action.

Hence, there is a need for more robust and scalable solutions for implementing mass haul optimization, particularly for implementing mass haul optimization for agricultural terrain forming, based at least in part on three-dimensional soil modeling.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF CERTAIN EMBODIMENTS

Overview

Figure 1:
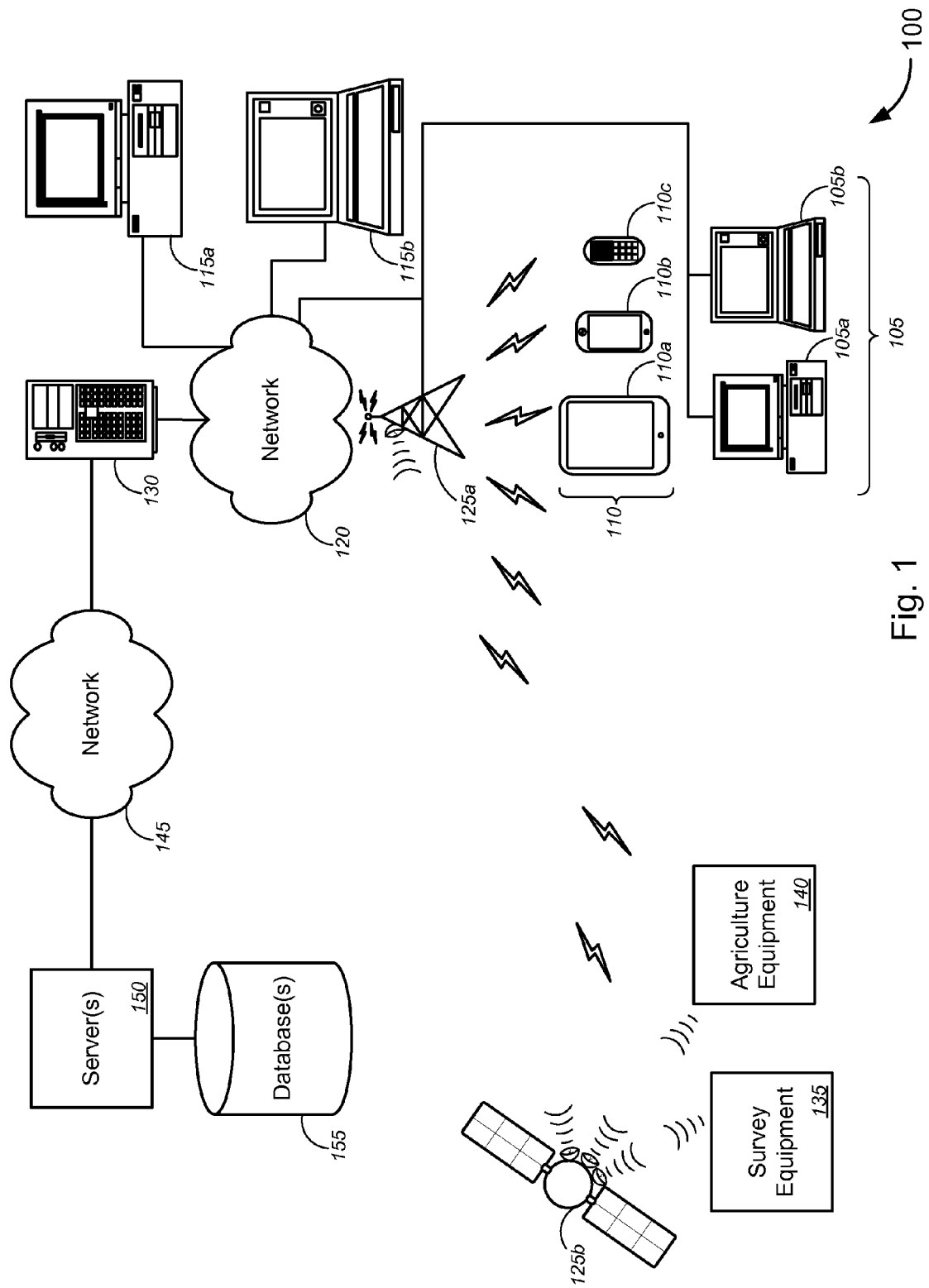
FIG. 1 is a schematic diagram illustrating a system for implementing mass haul optimization for agricultural terrain forming, based at least in part on three-dimensional soil modeling, in accordance with various embodiments.

Various embodiments provide techniques for implementing mass haul optimization for agricultural terrain forming, based at least in part on three-dimensional soil modeling.

In some embodiments, a computer system might determine desired soil conditions for an agricultural area. The desired soil conditions might include, without limitation, minimum topsoil depth, maximum and minimum slope, and/or the like. The computer system might also identify, based on 3-D topographical surveys and 3-D soil profiles of the agricultural area, one or more deficient locations within the agricultural area that do not possess at least the minimum topsoil depth, one or more excess locations that possess greater than the minimum topsoil depth, one or more sloped locations that exceed the maximum slope, and/or one or more flat locations whose slopes are less than the minimum slope, or the like. Costs and volumes of topsoil and/or subsurface material may be calculated by the computer system, and based on such calculations it may be determined, by the computer system, how much topsoil and/or subsurface material to relocate or order to achieve the desired topsoil depth and slope at each of the identified locations.

For example, it may be determined, based on cost calculations and the like, what volume of topsoil to relocate from one or more excess locations to one or more deficient locations, what volume of additional topsoil to order, ship, and relocate from a transport vehicle to the one or more deficient locations, or a combination of these approaches, in order to achieve at least the minimum topsoil depth at each of the one or more deficient locations. In a similar manner, it may be determined, based on cost calculations and the like, what volume of topsoil and/or subsurface material to relocate to/from the one or more sloped locations or to/from the one or more flat locations, what volume of additional topsoil and/or subsurface material to order, ship, and relocate to the one or more sloped locations or to the one or more flat locations, or what volume of topsoil and/or subsurface material to remove from the one or more sloped locations or from the one or more flat locations to a location outside the agricultural area, or a combination of these approaches, in order to achieve the desired slope within the maximum and minimum slopes at each of the one or more sloped locations and at each of the one or more flat locations. In some embodiments, the computer system might further send instructions to one or more agricultural machinery or equipment (including, but not limited to, at least one of earth-moving machines, tractors, plows, diggers, excavators, trucks, trailers, and/or the like that are configured to move a particular layer(s) of soil, dirt, rock, etc. from one location to another, and/or the like) to autonomously perform the relocation of topsoil and/or subsurface material in accordance with the determined mass haul approaches above.

In the manner described above (or a similar manner), mass haul optimization for agricultural terrain forming, based at least in part on three-dimensional soil modeling (including, without limitation, 3-D topographical surveys and/or 3-D soil profiles) may be achieved, while utilizing a consolidated system that determines the desired soil characteristics, identifying particular locations within the agricultural area for land-forming, determining the amount and type of soil to relocate to/from the identified locations, and instructing autonomous agricultural machines to perform the land-forming based on the such determinations.

The following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

The tools provided by various embodiments include, without limitation, methods, systems, and/or software products. Merely by way of example, a method might comprise one or more procedures, any or all of which are executed by a computer system. Correspondingly, an embodiment might provide a computer system configured with instructions to perform one or more procedures in accordance with methods provided by various other embodiments. Similarly, a computer program might comprise a set of instructions that are executable by a computer system (and/or a processor therein) to perform such operations. In many cases, such software programs are encoded on physical, tangible, and/or non-transitory computer readable media (such as, to name but a few examples, optical media, magnetic media, and/or the like).

Various embodiments described herein, while embodying (in some cases) software products, computer-performed methods, and/or computer systems, represent techniques that are not merely abstract ideas, such as a fundamental economic practice, a method of organizing human activity, an idea itself, or a mathematical relationship. To the extent that any abstract concepts are present in the various embodiments (for example if the identification of particular locations within the agricultural area being based on topographical surveys and soil profiles are deemed to utilize algorithms and/or mathematical formulations, and thus might be deemed to be directed to an abstract idea), those concepts utilize techniques and systems (particularly as claimed) that amount to significantly more than the mathematical operation and the abstract idea. In particular, the various embodiments represent tangible, concrete improvements to existing technological areas, including, without limitation, agricultural technology, land or terrain forming technology, and/or the like, and physical manifestations (i.e., physical changes to the land, improvements crop yield, improvements to irrigation, and/or the like) can be observed and measured. Further, those concepts can be implemented as described herein by devices, software, systems, and methods that involve specific novel functionality (e.g., steps or operations), such as implementing mass haul optimization for agricultural terrain forming, based at least in part on three-dimensional soil modeling, implementing land-forming based on such optimizations, and/or the like, to name a few examples, that extend beyond mere conventional computer processing operations. This functionality can produce tangible results outside of the implementing computer system, including, merely by way of example, changing topsoil depth at some locations throughout the agricultural area, changing slope at some locations throughout the agricultural area, optimizing crop yields, optimizing irrigation flows through the agricultural area, and/or the like.

In an aspect, a method of land forming for an agricultural area might be provided. The method might comprise creating, with a first computer, a three-dimensional topographic survey for the agricultural area and creating, with the first computer, a three-dimensional soil profile for the agricultural area. The three-dimensional topographic survey might comprise an outer boundary, while the three-dimensional soil profile might comprise information about topsoil depth throughout the agricultural area within the outer boundary. The method might also comprise determining, with a second computer, desired soil conditions for the agricultural area. The desired soil conditions might comprise a minimum topsoil depth for a plurality of locations within the agricultural area. The method might further comprise identifying, with the second computer, one or more deficient locations within the agricultural area that do not possess at least the minimum topsoil depth, based at least in part on the three-dimensional topographic survey and the three-dimensional soil profile. The method might comprise calculating, with the second computer, a volume of additional topsoil needed to obtain at least the minimum topsoil depth at the one or more deficient locations, and identifying, with the second computer, a plurality of excess locations within the agricultural area that possess greater than the minimum topsoil depth, based at least in part on the three-dimensional topographic survey and the three-dimensional soil profile. The method might further comprise determining, with the second computer, a volume of topsoil to relocate from one or more excess locations of the plurality of excess locations to the one or more deficient locations, based at least in part on an optimization of costs of relocating the volume of topsoil from each of the one or more excess locations to the one or more deficient locations.

Merely by way of example, in some instances, the three-dimensional soil profile might further comprise at least one of runoff coefficient, saturated hydraulic conductivity, consolidated soil composition, top-soil composition, and/or subsurface soil composition, or the like. According to some embodiments, the method might further comprise sending, with the second computer, instructions to one or more agricultural equipment to relocate the determined volume of topsoil from the one or more excess locations to the one or more deficient locations.

In some embodiments, the optimization of costs of relocating the volume of topsoil from each of the one or more excess locations to the one or more deficient locations might be based at least in part on the distance between each of the one or more excess locations and the one or more deficient locations. In some cases, the optimization of costs of relocating the volume of topsoil from each of the one or more excess locations to the one or more deficient locations might be based at least in part on costs of relocating the volume of additional topsoil needed to obtain at least the minimum topsoil depth at the one or more deficient locations. According to some embodiments, the optimization of costs of relocating the volume of topsoil from each of the one or more excess locations to the one or more deficient locations might be based at least in part on earth-moving equipment costs. In some instances, the optimization of costs of relocating the volume of topsoil from each of the one or more excess locations to the one or more deficient locations might be based at least in part on a cost of acquiring at least a portion of the volume of additional topsoil needed to obtain at least the minimum topsoil depth at the one or more deficient locations from a location outside of the agricultural area.

In some cases, determining the volume of topsoil to relocate from the one or more excess locations to the one or more deficient locations might comprise applying, with the second computer, a bulking factor to the volume of topsoil removed from the one or more excess locations. In some instances, calculating the volume of additional topsoil needed to obtain at least the minimum topsoil depth at the one or more deficient locations might comprise applying, with the second computer, a shrinkage factor to the volume of additional topsoil to add to the one or more deficient locations.

According to some embodiments, the method might further comprise identifying, with the second computer, a location to stockpile topsoil being relocated from the one or more excess locations to the one or more deficient locations, based at least in part on optimization of costs to stockpile topsoil. In some cases, the method might further comprise determining, with the second computer, a maximum allowable cost to relocate topsoil within the agricultural area, and determining the volume of topsoil to relocate from the one or more excess locations to the one or more deficient locations might comprise determining, with the second computer, a volume of topsoil to relocate from the one or more excess locations to the one or more deficient locations, based at least in part on the maximum allowable cost to relocate topsoil within the agricultural area.

Merely by way of example, in some cases, the three-dimensional soil profile for the agricultural area might further comprise at least one of a depth to bedrock, a depth of subsurface material between the topsoil and the bedrock, interior elevation measurement points, or manual elevation measurement points. In some embodiments, the desired soil conditions for the agricultural area further comprises a maximum slope, and the method might further comprise identifying, with the second computer, one or more sloped locations within the agricultural area that exceeds the maximum slope and calculating, with the second computer, a volume of subsurface material to relocate to obtain a slope that is less than the maximum slope at each of the one or more sloped locations. In some instances, the method might further comprise identifying, with the second computer, a location to stockpile the volume of subsurface material for relocating to or from each of the one or more sloped locations, based at least in part on the three-dimensional topographic survey and the three-dimensional soil profile. In some cases, the method might further comprise identifying, with the second computer, a location to stockpile topsoil when the volume of subsurface material is relocated to or from each of the one or more sloped locations, based at least in part on the three-dimensional topographic survey and the three-dimensional soil profile. According to some embodiments, calculating the volume of subsurface material to relocate to obtain a slope that is less than the maximum slope at each of the one or more sloped locations might comprise calculating, with the second computer, a volume of subsurface material to relocate to obtain a slope that is less than the maximum slope at each of the one or more sloped locations, based at least in part on an optimization of costs to relocate the volume of subsurface material.

In some embodiments, the desired soil conditions for the agricultural area might further comprise a minimum slope, and the method might further comprise identifying, with the second computer, one or more flat locations within the agricultural area that do not have at least the minimum slope and calculating, with the second computer, a volume of topsoil to relocate to obtain a slope that is at least the minimum slope at each of the one or more flat locations. The method, in some instances, might further comprise identifying, with the second computer, a location to stockpile the volume of topsoil to relocate to obtain a slope that is at least the minimum slope at each of the one or more flat locations, based at least in part on the three-dimensional topographic survey and the three-dimensional soil profile. In some cases, calculating the volume of topsoil needed to obtain a slope that is at least the minimum slope at each of the one or more flat locations might comprise calculating, with the second computer, the volume of topsoil needed to obtain a slope that is at least the minimum slope at each of the one or more flat locations, based at least in part on an optimization of costs of acquiring a volume of supplemental topsoil needed to obtain a slope that is at least the minimum slope at the one or more flat locations from a location outside of the agricultural area. According to some embodiments, calculating the volume of topsoil needed to obtain a slope that is at least the minimum slope at each of the one or more flat locations might further comprise applying, with the second computer, a shrinkage factor to the volume of supplemental topsoil to add to the one or more deficient locations. According to some embodiments, the first computer and the second computer might be the same computer.

In another aspect, a computer system might comprise one or more processors and a computer readable medium in communication with the one or more processors. The computer readable medium might have encoded thereon a set of instructions executable by the one or more processors to cause the computer system to perform one or more operations. The set of instructions might comprise instructions for creating a three-dimensional topographic survey for the agricultural area that comprises an outer boundary, instructions for creating a three-dimensional soil profile for the agricultural area that comprises information about topsoil depth throughout the agricultural area within the outer boundary, and instructions for determining desired soil conditions for the agricultural area that comprise a minimum topsoil depth for a plurality of locations within the agricultural area. The set of instructions might also comprise instructions for identifying one or more deficient locations within the agricultural area that do not possess at least the minimum topsoil depth, based at least in part on the three-dimensional topographic survey and the three-dimensional soil profile, and instructions for calculating a volume of additional topsoil needed to obtain at least the minimum topsoil depth at the one or more deficient locations. The set of instructions might further comprise instructions for identifying a plurality of excess locations within the agricultural area that possess greater than the minimum topsoil depth, based at least in part on the three-dimensional topographic survey and the three-dimensional soil profile, and instructions for determining a volume of topsoil to relocate from one or more excess locations of the plurality of excess locations to the one or more deficient locations, based at least in part on an optimization of costs of relocating the volume of topsoil from each of the one or more excess locations to the one or more deficient locations.

Various modifications and additions can be made to the embodiments discussed without departing from the scope of the invention. For example, while the embodiments described above refer to particular features, the scope of this invention also includes embodiments having different combination of features and embodiments that do not include all of the above described features.

Specific Exemplary Embodiments

We now turn to the embodiments as illustrated by the drawings. FIGS. 1-7 illustrate some of the features of the method, system, and apparatus for implementing mass haul optimization for agricultural terrain forming, based at least in part on three-dimensional soil modeling, as referred to above. The methods, systems, and apparatuses illustrated by FIGS. 1-7 refer to examples of different embodiments that include various components and steps, which can be considered alternatives or which can be used in conjunction with one another in the various embodiments. The description of the illustrated methods, systems, and apparatuses shown in FIGS. 1-7 is provided for purposes of illustration and should not be considered to limit the scope of the different embodiments.

With reference to the figures, FIG. 1 is a general schematic diagram illustrating a system 100 for implementing mass haul optimization for agricultural terrain forming, based at least in part on three-dimensional soil modeling, in accordance with various embodiments.

In the embodiment of FIG. 1, system 100 might include one or more user devices 105 associated with a user (e.g., an owner, manager, or operator of an agricultural property, which might include, without limitation, a farm, a ranch, an orchard, a plantation, and/or the like). The one or more user devices 105 might include, but are not limited to, a desktop computer(s) 105*a*, a laptop computer(s) 105*b*, and one or more mobile user devices 110, which might include, without limitation, a tablet computer(s) 110*a*, a smart phone 110*b*, a mobile phone 110*c*, and/or the like. System 100 might further include, but is not limited to, one or more computing systems 115 (including a desktop-based computing system 115*a*, a laptop-based computing system 115*b*, or the like) and a server computer 130. In some embodiments, system 100 might further include one or more survey equipment 135 and one or more agricultural equipment 140. The one or more survey equipment 135 might include, without limitation, at least one of air-based land survey equipment, land-based survey equipment, hand-held survey equipment, vehicle-based survey equipment, satellite-based land survey equipment, cameras, and/or the like. The one or more agricultural equipment 140 might include, but are not limited to, at least one of earth-moving machines, tractors, plows, diggers, excavators, trucks, trailers, and/or the like that are configured to move a particular layer(s) of soil, dirt, rock, etc. from one location to another, and/or the like.

Each of the one or more user devices 105/110, the one or more computing systems 115, the server computer 130, the one or more survey equipment 135, and the one or more agricultural equipment 140 might communicatively couple to each other via network 120, in some cases, via one or more telecommunications relay systems 125. The one or more telecommunications relay systems 125 might include, without limitation, one or more wireless network interfaces (e.g., wireless modems, wireless access points, and the like), one or more towers, one or more satellites, and/or the like.

According to some embodiments, system 100 might further comprise network 145, server(s) 150, and database(s) 155 that communicatively couple to server computer 130. In some instances, network 120 and network 145 can each include a local area network ("LAN"), including, without limitation, a fiber network, an Ethernet network, a Token-Ring™ network and/or the like; a wide-area network ("WAN"); a wireless wide area network ("WWAN"); a virtual network, such as a virtual private network ("VPN"); the Internet; an intranet; an extranet; a public switched telephone network ("PSTN"); an infra-red network; a wireless network, including, without limitation, a network operating under any of the IEEE 802.11 suite of protocols, the Bluetooth™ protocol known in the art, and/or any other wireless protocol; or any combination of these and/or other networks. In a particular embodiment, the network 120 or 145 might include an access network of the service provider (e.g., an Internet service provider ("ISP")). In another embodiment, the network 120 or 145 might include a core network of the service provider, and/or the Internet.

Figure 2A:
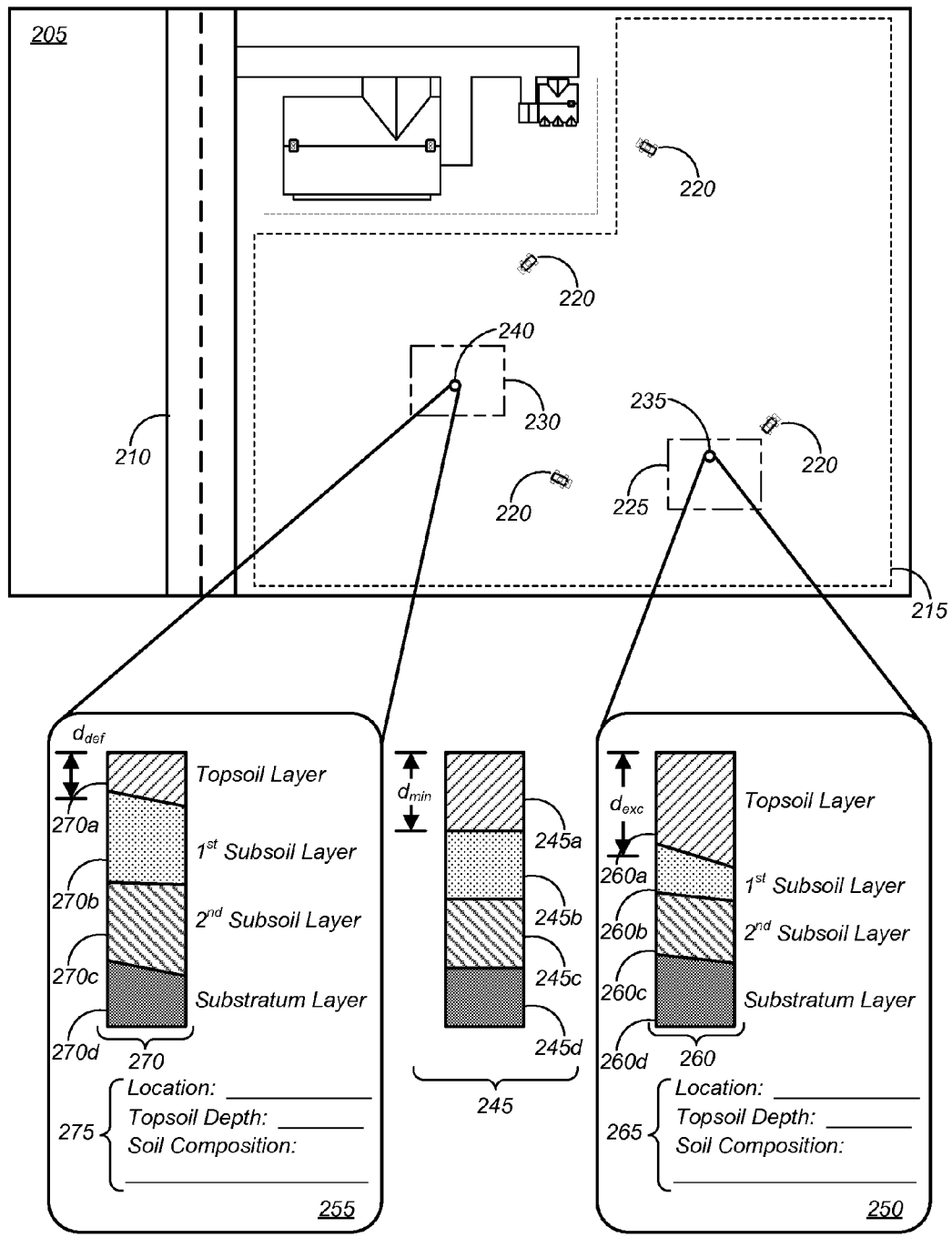
FIGS. 2A and 2B are schematic diagrams illustrating agricultural land and soil characteristics that can be modeled and taken into consideration when implementing mass haul optimization for agricultural terrain forming, based at least in part on three-dimensional soil modeling, in accordance with various embodiments.
Figure 2B:
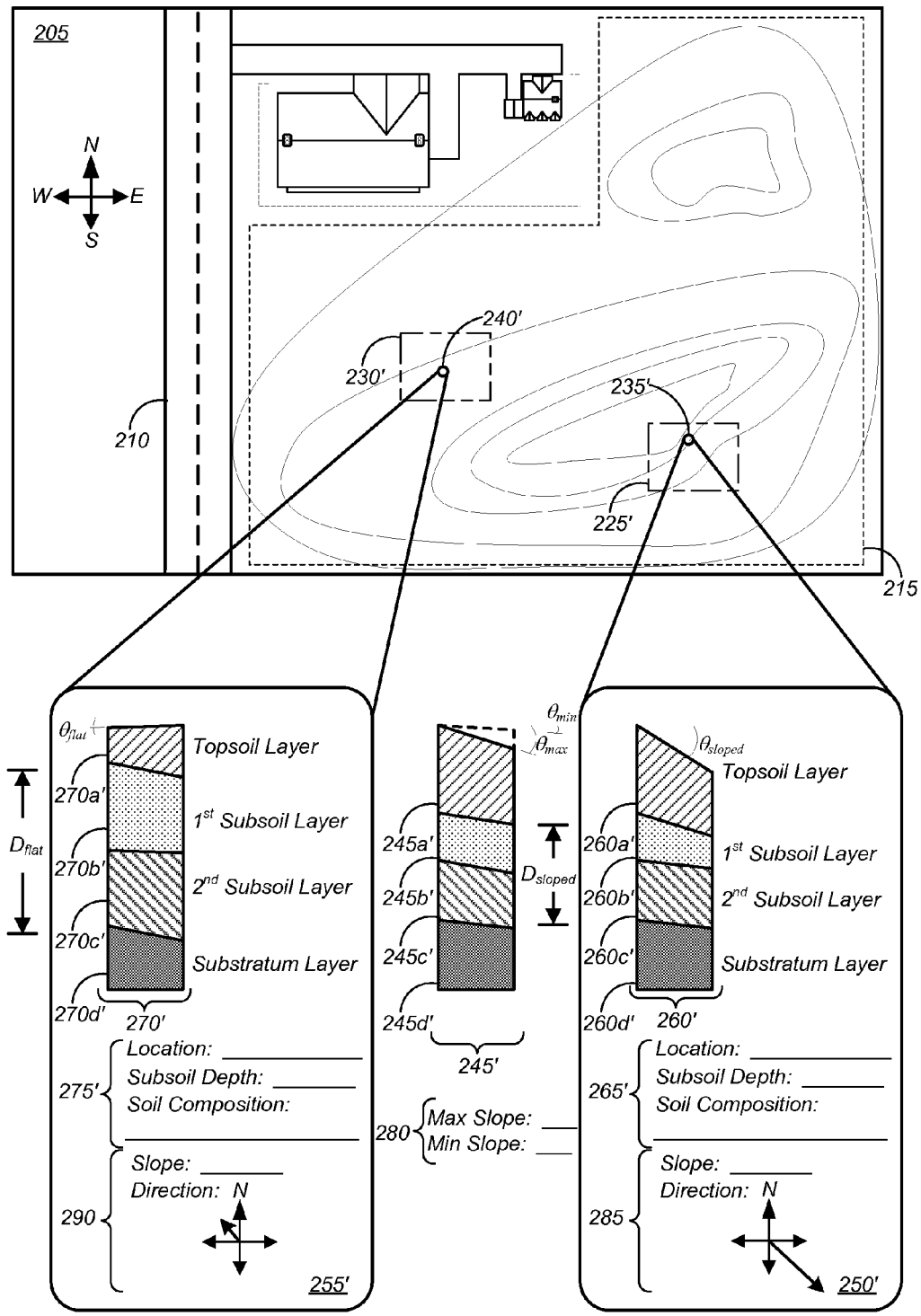

In operation, one or more of computers 115a or 115b, server 130, and/or server(s) 150 might perform each of the processes in the methods described in detail with respect to FIGS. 3-5 below, based at least in part on land and soil characteristics as shown in FIGS. 2A and 2B (that, in some cases, may be part of 3-D soil modeling, including, without limitation, 3-D topographical survey(s) and/or 3-D soil profile(s) of the agricultural area, or the like). The one or more user devices 105 (including the one or more mobile user devices 110) might allow the user to control any or all of the processes for implementing mass haul optimization for agricultural terrain forming, from ordering 3-D topographical surveys and/or 3-D soil profiles of the agricultural area (each of whose data is obtained by survey equipment 135), to viewing the 3-D topographical surveys and/or 3-D soil profiles (or at least information derived from these sources or from other sources), to instructing one or more of computers 115a or 115b, server 130, and/or server(s) 150 to perform each of the processes in the methods 300-500—including, without limitation, determining desired soil conditions, identifying deficient, excess, sloped, flat, and/or deposit locations, calculating volumes of topsoil and/or subsurface material to relocate and/or order, determining costs for each of a host of various alternative or additional courses for implementing topsoil or subsurface material relocation or ordering, and sending instructions to agricultural equipment to perform the topsoil or subsurface material relocation, and/or the like.

Herein, in some embodiments, the agricultural equipment 140 and/or the survey equipment 135 might autonomously operate (i.e., operate without direct human control, except for general instructions to obtain survey information or to relocate topsoil and/or subsurface material from location A to location B, or the like) based at least in part on the instructions sent to it from the user via the user devices 105 and/or from any of the computers 115a or 115b, server 130, and/or server(s) 150, or the like. In alternative embodiments, the agricultural equipment 140 and/or the survey equipment 135 might be configured to operate in an "autopilot" mode that is similar to the autonomous operation above, except that a human operator (who is either located in, at, or near the equipment 135/140, or located remotely with remote control functionality enabled) might also be (physically or remotely) "present" to switch from "autopilot" mode to "manual mode." In "manual mode," displays might be provided to the human operator to indicate the determined (in some cases, optimized) paths for the agricultural equipment 140 and/or the survey equipment 135, as well as the actual positions and movements of the agricultural equipment 140 and/or the survey equipment 135 so that the human operator can maintain or correct the course of the agricultural equipment 140 and/or the survey equipment 135 to match the determined (or optimized) paths. In some cases, the human operator might disregard the determined (or optimized) path, and the computers 115a or 115b, server 130, and/or server(s) 150, or the like might perform updated determinations and/or calculations in response to the course by the human operator.

FIGS. 2A and 2B (collectively, "FIG. 2") are schematic diagrams illustrating agricultural land and soil characteristics that can be modeled and taken into consideration when implementing mass haul optimization for agricultural terrain forming, based at least in part on three-dimensional soil modeling, in accordance with various embodiments. FIG. 2A is directed to situations and implementations that consider topsoil depth (which are described in detail below with respect to FIGS. 3 and 4), while FIG. 2B is directed to situations and implementations that consider maximum and/or minimum slope (which are described in detail below with respect to FIGS. 5A and 5B).

With reference to FIG. 2, system 200 might comprise location or region 205, which might include, without limitation, one or more roadways or vehicular paths 210, and an agricultural area 215, which might be part of an agricultural property (e.g., a farm, a plantation, a ranch, an orchard, and/or the like). In some cases, the agricultural property might include a residence (e.g., farmhouse, ranch house, etc.) and a covered work facility (e.g., a barn, a covered storage structure, and/or the like), with a vehicle access path between each of the residence and the covered work facility to the roadway 210. A full or partial fence might surround at least a portion of the residence and/or covered work facility. Although the particular agricultural property or agricultural area 215 in FIG. 2 does not possess any bodies of water, waterways, rock formations, and/or other natural (or manmade) landscape features, or the like, the various embodiments are not so limited and the various systems and methods herein may be applied to implement mass haul optimization for agricultural terrain forming, based at least in part on three-dimensional soil modeling, in view of (or regardless of) presence of any combination of bodies of water, waterways, rock formations, and/or other natural (or manmade) landscape features, or the like. In some embodiments, in the process of implementing mass haul techniques, at least portions of a drainage system may be designed and/or implemented. Design and/or implementation of a drainage system for an agricultural area, which may be applied herein, is described in detail in the 0420.25 application, which has already been incorporated herein by reference in its entirety for all purposes.

With regard to implementing mass haul optimization for agricultural terrain forming and/or for implementing three-dimensional soil modeling, system 200 might comprise survey equipment (not shown in FIG. 2), which might include, without limitation, at least one of air-based land survey equipment, land-based survey equipment, hand-held survey equipment, vehicle-based survey equipment, satellite-based land survey equipment, cameras, and/or the like. System 200 might further comprise one or more agricultural machinery or equipment 220, which might include, but are not limited to, at least one of earth-moving machines, tractors, plows, diggers, excavators, trucks, trailers, and/or the like that are configured to move a particular layer(s) of soil, dirt, rock, etc. from one location to another, and/or the like.

In operation, as described in greater detail below with respect to FIGS. 3 to 5B, a three-dimensional (or "3-D") topographical survey(s) and a 3-D soil profile(s) might be created for agricultural area 215. Based on determined desired soil conditions—such as, for example, minimum topsoil depth—one or more excess locations 225 and one or more deficient locations 230 might be identified. Soil profiles 260 and 270 for the specific spot 235 of the one or more excess locations 225 and for the specific spot 240 of the one or more deficient locations 230, respectively, provide a basis for determining or calculating a volume of topsoil needed to obtain at least the minimum topsoil depth at the one or more deficient locations 230.

In FIG. 2A, soil profile 245 might represent model or desired (ranges of values) for soil conditions for the agricultural area. The soil profile 245 might indicate a model topsoil layer 245a, including a minimum topsoil depth $d_{min}$. In some embodiments, the soil profile 245 might further indicate a first subsurface material layer 245b and a second subsurface material layer 245c (in some cases, the first and second subsurface material layers 245b and 245c might be the same layer, while in other cases a third subsurface material layer or additional subsurface material layers might be present), along with a substratum layer 245d. Herein, "topsoil" or "topsoil layer" might refer to a layer of earth that is rich in mineral and organic matter that promotes or facilitates plant growth or the like. The "substratum" layer might refer to a bedrock layer, which might include any combination of granite, basalt, quartzite, limestone, sandstone, or other rocky structure that serves as a foundational layer. The "subsurface material" or "subsoil" layer(s) might refer to intermediate layer(s) between the topsoil layer and the substratum layer, and might include a mineral-rich (organic-free or low concentration organic substance) layer, a sand or silt layer, a parent material layer, and/or the like. The "parent material" layer might refer to an underlying geological material layer that may include consolidated or unconsolidated mineral material. The mineral-rich layer and the sand or silt layer typically inherit structure and minerals from the parent material in the parent material layer, and thus might reflect chemical or physical alterations of the parent material.

As shown in the embodiment of FIG. 2A, data 250 might represent or display information regarding the soil profile, the soil conditions, and related information at each of the one or more excess locations 225, while data 255 might similarly represent or display information regarding the soil profile, the soil conditions, and related information at each of the one or more deficient locations 230. In some cases, data 250 and 255 might represent data derived from the created 3-D soil profile(s) and/or the created 3-D topographical survey(s) of the agricultural area 215. Alternatively or additionally, data 250 and 255 might represent information regarding the soil profile, the soil conditions, and related information derived from other sources.

In FIG. 2A, data 250 might include information about the soil profile 260, which might include information about topsoil layer 260a, including topsoil depth $d_{exc}$. In some embodiments, the soil profile 260 might further indicate a first subsurface material layer 260b, a second subsurface material layer 260c, and a substratum layer 260d. In some cases, the first and second subsurface material layers 260b and 260c might be the same layer, while in other cases a third subsurface material layer or additional subsurface material layers might be present. Data 250, in some embodiments, might further include additional information 265 regarding the location of the particular excess location 225 (and perhaps the specific spot or portion 235 within the particular excess location 225 that was tested or analyzed to produce the soil profile 260). In some instances, the location might include the latitude and longitude, and, in some cases, might further include altitude (or elevation from sea level) of a center of the specific spot or portion 235 within the particular excess location 225 that was tested or analyzed to produce the soil profile 260. In some cases, the location might include coordinates (including latitude, longitude, and, in some case, altitude or elevation from sea level) of three or more corners of a geographic patch of land representing the particular excess location 225. The additional information 265, according to some embodiments, might further include topsoil depth values $d_{exc}$, specific soil compositions (including depths of layers) for the specific spot or portion 235, average soil compositions (including average depths of layers) throughout the patch of land representing the particular excess location 225.

Similarly, data 255 might include information about the soil profile 270, which might include information about topsoil layer 270a, including topsoil depth $d_{def}$. In some embodiments, the soil profile 270 might further indicate a first subsurface material layer 270b, a second subsurface material layer 270c, and a substratum layer 270d. In some cases, the first and second subsurface material layers 270b and 270c might be the same layer, while in other cases a third subsurface material layer or additional subsurface material layers might be present. Data 255, in some embodiments, might further include additional information 275 regarding the location of the particular deficient location 230 (and perhaps the specific spot or portion 240 within the particular deficient location 230 that was tested or analyzed to produce the soil profile 270). In some instances, the location might include the latitude and longitude, and, in some cases, might further include altitude (or elevation from sea level) of a center of the specific spot or portion 240 within the particular deficient location 230 that was tested or analyzed to produce the soil profile 270. In some cases, the location might include coordinates (including latitude, longitude, and, in some case, altitude or elevation from sea level) of three or more corners of a geographic patch of land representing the particular deficient location 230. The additional information 275, according to some embodiments, might further include topsoil depth values $d_{def}$, specific soil compositions (including depths of layers) for the specific spot or portion 240, average soil compositions (including average depths of layers) throughout the patch of land representing the particular deficient location 230. According to some embodiments, the additional information 265 or 275 might each further include characteristics including, without limitation, root zone depth, soil texture components (e.g., sand, clay, coarse fragment content, and/or the like), soil texture classes, plant-available water, compaction and hardpan characteristics, nutrient holding capacity and levels, salt concentrations, toxicity concentrations, and/or the like. Based on the additional information 265 or 275, users can be provided with information on available water, soil texture, nutrient holding capacity, nutrient distribution, etc. In some cases, manipulation of any of these information or characteristics (or a combination of these characteristics) might demonstrate differential rates of fertilizer and amendment applications. In some embodiments, the additional information 265 or 275 may be output in a consumable form to a 3-D design engine that may be used to optimize mass haul within the agricultural area.

As shown in FIG. 2A, the topsoil layer 270a of deficient location 230 has a topsoil depth $d_{def}$ that is less than the minimum topsoil depth $d_{min}$ as denoted by the model soil profile 245, while the topsoil layer 260a of excess location 225 has a topsoil depth $d_{exc}$ that is greater than the minimum topsoil depth $d_{min}$ as denoted by the model soil profile 245. Based on such topsoil depth determinations of the identified deficient and excess locations—along with distance determinations, cost determinations of relocation of topsoil from excess locations 225 to deficient locations 230, and/or cost determinations of ordering, shipping, and relocating additional topsoil from a location(s) outside the agricultural area 215 to the deficient locations 230—it may be determined, by a computer system (e.g., computer 115a or 115b, server 130, or server(s) 150 as shown in FIG. 1), the volume of topsoil to relocate to each of the one or more deficient locations 230 (either from the one or more excess locations and/or from the location(s) outside the agricultural area 215). Based on such determination, the computer system might send instructions to the one or more agricultural machinery or equipment 220 to relocate the determined volume of topsoil to each of the one or more deficient locations 230 (either from the one or more excess locations and/or from the location(s) outside the agricultural area 215).

With reference to FIG. 2B, a contour map is shown overlaid over the depiction (or map illustration) of at least the agricultural area 215. It should be appreciated that the cardinal directions indicated in FIG. 2B are merely illustrative and are used to provide context for the direction of slope for slope information 285 and 290 in data 250' and 255', respectively, as described in detail below. As shown in the embodiment of FIG. 2B, model soil profile 245' might further include model slope information 280, which might include a maximum slope $\theta_{max}$ and a minimum slope $\theta_{min}$. The maximum slope $\theta_{max}$ might represent a slope above which agricultural machinery or equipment 220 might be likely to tip over, or the like, while the minimum slope $\theta_{min}$ might represent a slope below which issues of insufficient water drainage and water flow might arise, or the like.

As illustrated in FIG. 2B, data 250' might include soil profile 260' for one or more "sloped" locations 225' (or for a specific spot or portion 235' of the one or more sloped locations 225'). Similarly, data 255' might include soil profile 270' for one or more "flat" locations 230' (or for a specific spot or portion 240' of the one or more flat locations 230'). The soil profile 260' of the sloped locations 225' and the soil profile 270' of the flat locations 230' might each generally correspond to (or is generally similar to) soil profile 260 or 270 of excess locations 225 or deficient locations 230, respectively, of the embodiment of FIG. 2A. Soil profile 260' might include information about topsoil layer 260a', a first subsurface material layer 260b', a second subsurface material layer 260c', and a substratum layer 260d'. Soil profile 270' might include information about topsoil layer 270a', a first subsurface material layer 270b', a second subsurface material layer 270c', and a substratum layer 270d'. The topsoil layers 260a' and 270a', the first subsurface material layer 260b' and 270b', a second subsurface material layer 260c' and 270c', and a substratum layer 260d' and 270d' might generally correspond to (or is generally similar to) topsoil layer 260a or 270a, a first subsurface material layer 260b or 270b, a second subsurface material layer 260c or 270c, and a substratum layer 260d or 270d. In the various embodiments, each sloped location 225' might be one of an excess location 225, a deficient location 230, or some other location within the agricultural area 215. Likewise, each flat location 230' might be one of an excess location 225, a deficient location 230, or some other location within the agricultural area 215.

In some embodiments, data 250' might include additional information 265', while data 255' might include additional information 275'. Additional information 265' and additional information 275' might each generally correspond to (or is generally similar to) additional information 265 or 275, and might each include information regarding the location of the particular sloped location 225' or flat location 230' (and perhaps the specific spot or portion 235' or the specific spot or portion 240'), the subsurface material layer depth (also referred to as subsoil depth) $D_{sloped}$ or $D_{flat}$, and the soil composition or average soil compositions, and/or the like. In some cases, $D_{sloped}$ might represent depth of the subsurface material or subsoil layer(s) 260b-260c of the sloped locations 225'. In some instances, $D_{flat}$ might represent depth of the subsurface material or subsoil layer(s) 270b-270c of the flat locations 230'.

According to some embodiments, data 250' might further include additional slope information 285, which might include, but is not limited to, magnitude of slope at the specific spot or portion 235' of the particular sloped location 225' (and/or average magnitude of slope at the particular sloped location 225') and direction of slope at the specific spot or portion 235' of the particular sloped location 225' (and/or average direction of slope at the particular sloped location 225'), which can be represented in any suitable manner (not necessarily limited to using diagrammatic notation of the cardinal directions with the additional arrow indicating both direction and magnitude of slope). Similarly, data 255' might further include additional slope information 290, which might include, but is not limited to, magnitude of slope at the specific spot or portion 240' of the particular flat location 230' (and/or average magnitude of slope at the particular flat location 230') and direction of slope at the specific spot or portion 240' of the particular flat location 230' (and/or average direction of slope at the particular flat location 230'), which can be represented in any suitable manner (not necessarily limited to using diagrammatic notation of the cardinal directions with the additional arrow indicating both direction and magnitude of slope).

As shown in FIG. 2B, the slope ($\theta_{flat}$) of topsoil layer 270a' of flat location 230' might be less than the model minimum slope ($\theta_{min}$), as shown with respect to the slope of topsoil layer 245a in model soil profile 245 in FIG. 2B. In some embodiments, only the values of maximum and minimum slopes may be provided (as provided in model slope information 280). Also shown in FIG. 2B, the slope ($\theta_{sloped}$) of topsoil layer 260a' of sloped location 225' might be greater than the model maximum slope ($\theta_{max}$). Locations having a slope that is greater than the model minimum slope ($\theta_{min}$) but less than the model maximum slope ($\theta_{max}$) (as shown with respect to the slope of topsoil layer 245a in model soil profile 245 in FIG. 2B) may be deemed normal or acceptable, and thus do not need to have its slope changed.

Based on such slope determinations of the identified sloped and flat locations—along with distance determinations, cost determinations of relocation of topsoil and/or subsurface material layers from/to sloped locations 225' or from/to flat locations 230', and/or cost determinations of ordering, shipping, and relocating additional topsoil and/or subsurface material from a location(s) outside the agricultural area 215 to the sloped locations 225' and/or the flat locations 230'—it may be determined, by a computer system (e.g., computer 115a or 115b, server 130, or server(s) 150 as shown in FIG. 1), the volume of topsoil and/or subsurface material to relocate to/from each of the one or more sloped locations 225' and/or to/from each of the one or more flat locations 230' (either from/to a location within the agricultural area 215 and/or from/to the location(s) outside the agricultural area 215). Based on such determination, the computer system might send instructions to the one or more agricultural machinery or equipment 220 to relocate the determined volume of topsoil and/or subsurface material to/from each of the one or more sloped locations 225' and/or to/from each of the one or more flat locations 230' (either from/to a location within the agricultural area 215 and/or from/to the location(s) outside the agricultural area 215).

Figure 3:
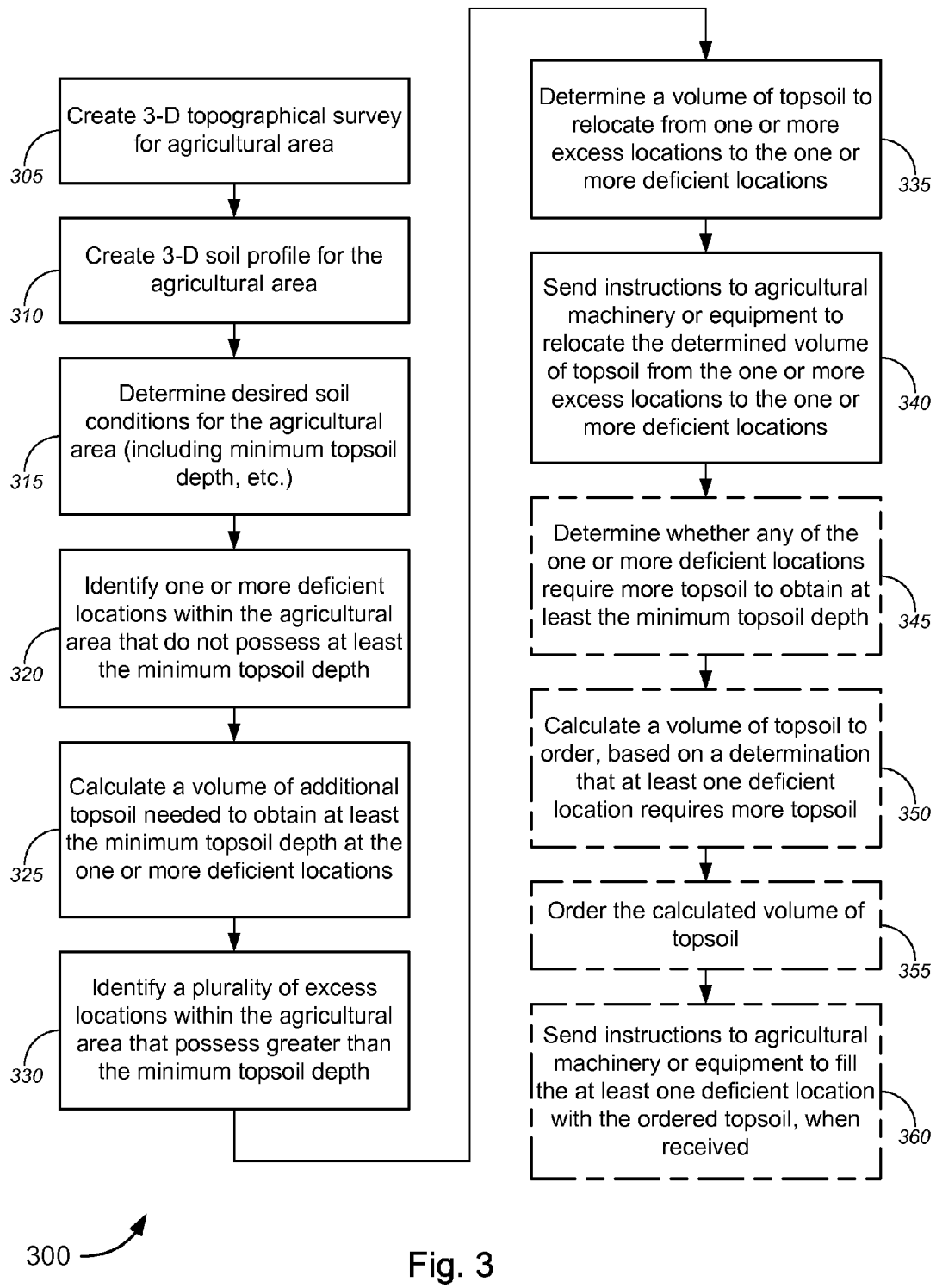
FIG. 3 is a flow diagram illustrating a method for implementing mass haul optimization for agricultural terrain forming, based at least in part on three-dimensional soil modeling, in accordance with various embodiments.

FIG. 3 is a flow diagram illustrating a method 300 for implementing mass haul optimization for agricultural terrain forming, based at least in part on three-dimensional soil modeling, in accordance with various embodiments. While the techniques and procedures are depicted and/or described in a certain order for purposes of illustration, it should be appreciated that certain procedures may be reordered and/or omitted within the scope of various embodiments. Moreover, while the method illustrated by FIG. 3 can be implemented by or with (and, in some cases, are described below with respect to) the systems 100 and 200 of FIGS. 1 and 2, respectively (or components thereof), such methods may also be implemented using any suitable hardware implementation. Similarly, while each of the system 100 (and/or components thereof) of FIG. 1 or the system 200 (and/or components thereof) of FIG. 2 can operate according to the method illustrated by FIG. 3 (e.g., by executing instructions embodied on a computer readable medium), the systems 100 and 200 can each also operate according to other modes of operation and/or perform other suitable procedures.

In the embodiment of FIG. 3, method 300 might comprise, at block 305, creating a three-dimensional topographic survey for the agricultural area. In some cases, the three-dimensional topographic survey might comprise an outer boundary (which might represent a property boundary for a farm or other agricultural land area, a boundary around actual portions of the farm or other agricultural land area in which the topsoil and/or subsurface material should be monitored and levels of which may be adjusted in accordance with the various embodiments, a boundary around actual portions of the farm or other agricultural land area in which drainage systems and water flow should be monitored and drainage systems should be installed or otherwise modified or adjusted as described in detail in the 0420.25 application (which is already incorporated herein by reference in its entirety), and/or the like). At block 310, method 300 might comprise creating a three-dimensional soil profile for the agricultural area. In some instances, the three-dimensional soil profile might comprise information about topsoil depth throughout the agricultural area within the outer boundary. In some embodiments, the three-dimensional soil profile, at particular locations, might further comprise at least one of runoff coefficient, saturated hydraulic conductivity (sometimes referred to a saturation factor $K_{sat}$, or the like) of soil, consolidated soil composition, top-soil composition, and/or subsurface soil composition, or the like.

According to some embodiments, method 300, at block 315, might comprise determining desired soil conditions for the agricultural area. In some cases, the desired soil conditions might comprise a minimum topsoil depth for a plurality of locations within the agricultural area. Method 300 might further comprise identifying one or more deficient locations within the agricultural area that do not possess at least the minimum topsoil depth (block 320), calculating a volume of additional topsoil needed to obtain at least the minimum topsoil depth at the one or more deficient locations (block 325), and identifying a plurality of excess locations within the agricultural area that possess greater than the minimum topsoil depth (block 330). In some instances, one or both of the processes at blocks 320 and 330 might be performed based at least in part on the three-dimensional topographic survey and the three-dimensional soil profile, or based at least in part on three-dimensional mass haul optimization models (that may be based at least in part on one or more of the three-dimensional topographic survey and/or the three-dimensional soil profile), and/or the like. As can be appreciated by those having skill in the art, even if an excess location possesses greater than the minimum topsoil depth, that particular excess location might be unsuitable as a source of topsoil for relocation to the one or more deficient locations, for any number of reasons, including, but not limited to, shrinkage considerations for that depth of topsoil at that location might make that depth of topsoil the effective minimum depth when wet, wind erosion considerations might likewise make that depth of topsoil the effective minimum depth, slope considerations might also make that depth of topsoil the effective minimum depth, and so on.

In some embodiments, method 300 might comprise, at block 335, determining a volume of topsoil to relocate from one or more excess locations of the plurality of excess locations to the one or more deficient locations. In some cases, determining the volume of topsoil to relocate may be based at least in part on an optimization of costs of relocating the volume of topsoil from each of the one or more excess locations to the one or more deficient locations. In some cases, the optimization of costs of relocating the volume of topsoil from each of the one or more excess locations to the one or more deficient locations might be based at least in part on the distance between each of the one or more excess locations and the one or more deficient locations. In some instances, the optimization of costs of relocating the volume of topsoil from each of the one or more excess locations to the one or more deficient locations might be based at least in part on costs of relocating the volume of additional topsoil needed to obtain at least the minimum topsoil depth at the one or more deficient locations. The optimization of costs of relocating the volume of topsoil from each of the one or more excess locations to the one or more deficient locations, might, in some cases, be based at least in part on earth-moving equipment costs. Alternatively, or additionally, the optimization of costs of relocating the volume of topsoil from each of the one or more excess locations to the one or more deficient locations might be based at least in part on a cost of acquiring at least a portion of the volume of additional topsoil needed to obtain at least the minimum topsoil depth at the one or more deficient locations from a location outside of the agricultural area.

Merely by way of example, in some aspects, determining the volume of topsoil to relocate from the one or more excess locations to the one or more deficient locations might comprise applying a bulking factor to the volume of topsoil removed from the one or more excess locations. Herein, "bulking factor" might refer to a ratio comparing a volume of a quantity of moist granular material to a volume of the same quantity when dry, or the like. According to some embodiments, calculating the volume of additional topsoil needed to obtain at least the minimum topsoil depth at the one or more deficient locations might comprise applying a shrinkage factor to the volume of additional topsoil to add to the one or more deficient locations. Herein, "shrinkage factor" might refer to capacity of soil or soil layers to shrink or swell when the soil becomes wet or dry. In some embodiments, determining the volume of topsoil to relocate from the one or more excess locations to the one or more deficient locations might be further based at least in part on one or more of soil physical composition, soil compaction, soil erodibility (which might be represented by an erosion index or erodibility index, or the like), soil chemical composition, surface tension, modeled flow rate, water capacity, 3-D mass haul optimization models (which might be based on one or more of these characteristics and/or based on the 3-D topographic survey(s) and the 3-D soil profile(s)), and/or the like.

At block 340, method 300 might comprise sending instructions to agricultural machinery or equipment (which might include, without limitation, one or more of earth-moving machines, tractors, plows, diggers, excavators, trucks, trailers, and/or other suitable machine or equipment that is configured to move a particular layer(s) of soil, dirt, rock, etc. from one location to another) to relocate the determined volume of topsoil from the one or more excess locations to the one or more deficient locations. In some cases, sending the instructions to relocate the determined volume of topsoil might include, without limitation, creating a guidance swath (or autopilot path or manual mode-assistance path) for each of the agricultural machinery or equipment (in some cases, within an array of similar agricultural machinery or equipment) to move from one position to another within the agricultural area, along with volume, length, width, and/or depth information, or the like, of which layers of soil to relocate to/from each identified location. In some instances, the guidance swath (or autopilot path or manual mode-assistance path) might include distance information and/or GPS or other location coordinates at one or more points along the path.

Optional blocks 345-360 are directed to situations in which relocating topsoil from the one or more excess locations to the one or more deficient locations is insufficient to achieve at least the minimum topsoil depth at each of the one or more deficient locations, and ordering additional topsoil from a location outside the agricultural area is necessary. At optional block 345, method 300 might comprise determining whether any of the one or more deficient locations require more topsoil to obtain at least the minimum topsoil depth. Method 300, at optional block 350, might comprise calculating a volume of topsoil to order, based on a determination that at least one deficient location requires more topsoil. Method 300 might further comprise ordering the calculated volume of topsoil (optional block 355) and sending instructions to agricultural machinery or equipment (in a manner similar to that in the process of block 340) to fill the at least one deficient location with the ordered topsoil, when received or delivered to the agricultural area.

Figure 4:
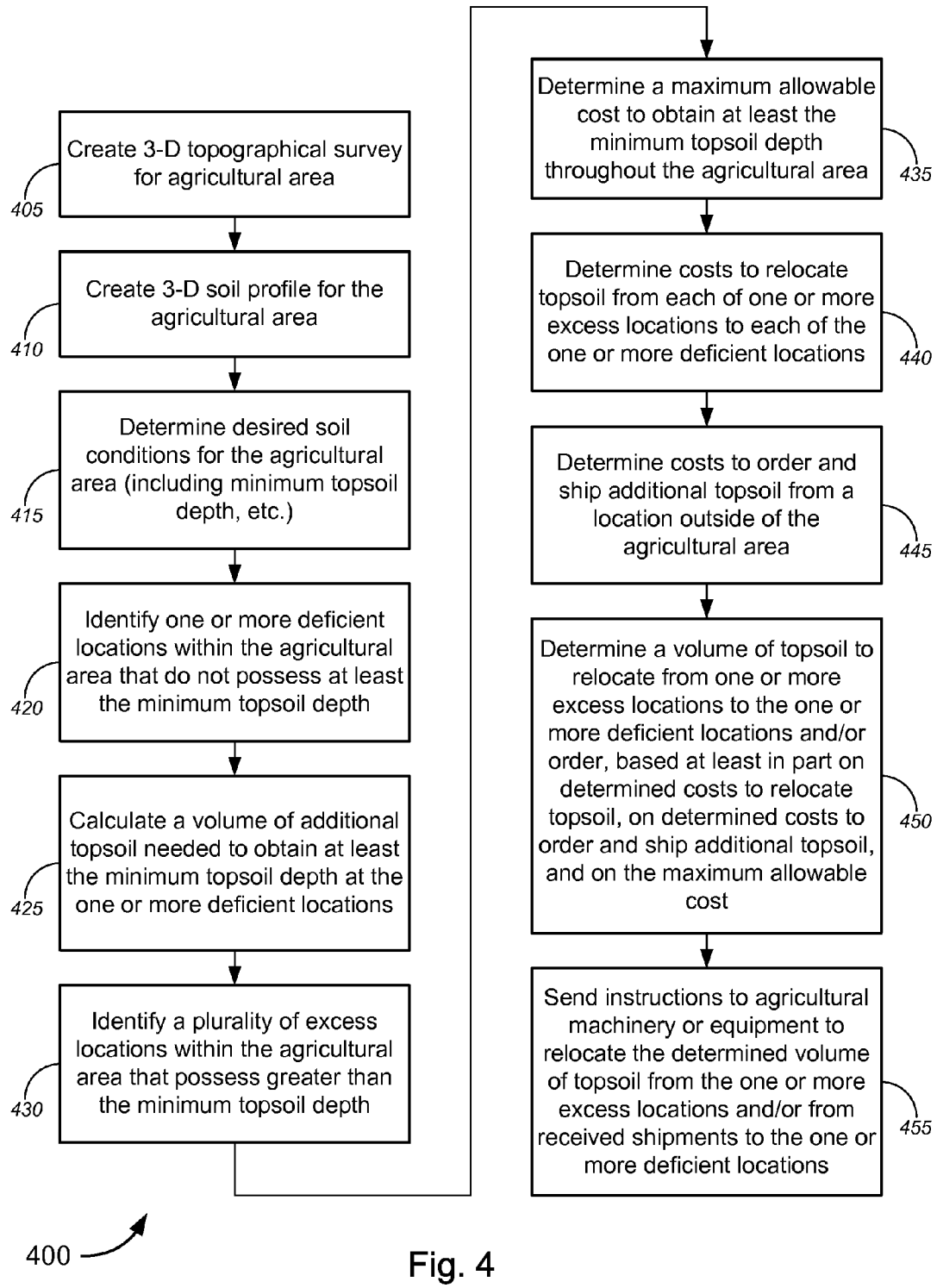
FIG. 4 a flow diagram illustrating another method for implementing mass haul optimization for agricultural terrain forming, based at least in part on three-dimensional soil modeling, in accordance with various embodiments.

FIG. 4 a flow diagram illustrating another method 400 for implementing mass haul optimization for agricultural terrain forming, based at least in part on three-dimensional soil modeling, in accordance with various embodiments. Method 400 of FIG. 4 is similar to method 300 of FIG. 3, except that method 400 also takes into consideration costs of relocating topsoil within the agricultural area and costs of ordering and shipping additional topsoil from a location outside the agricultural area.

While the techniques and procedures are depicted and/or described in a certain order for purposes of illustration, it should be appreciated that certain procedures may be reordered and/or omitted within the scope of various embodiments. Moreover, while the method illustrated by FIG. 4 can be implemented by or with (and, in some cases, are described below with respect to) the systems 100 and 200 of FIGS. 1 and 2, respectively (or components thereof), such methods may also be implemented using any suitable hardware implementation. Similarly, while each of the system 100 (and/or components thereof) of FIG. 1 or the system 200 (and/or components thereof) of FIG. 2 can operate according to the method illustrated by FIG. 4 (e.g., by executing instructions embodied on a computer readable medium), the systems 100 and 200 can each also operate according to other modes of operation and/or perform other suitable procedures.

In method 400 of FIG. 4, the processes at blocks 405-430 are similar to, if not identical to, the processes at blocks 305-330. Thus descriptions of the processes at blocks 305-330 similarly apply to the processes at blocks 405-430, and are omitted here to avoid excessive duplication.

At block 435, method 400 might comprise determining a maximum allowable cost to obtain at least the minimum topsoil depth throughout the agricultural area. Method 400 might further comprise determining costs to relocate topsoil from each of one or more excess locations among the plurality of excess locations to each of the one or more deficient locations (block 440) and determining costs to order and ship additional topsoil from a location outside of the agricultural area (block 445).

Method 400, at block 450, might comprise determining a volume of topsoil to relocate from one or more excess locations to the one or more deficient locations and/or to order and ship from the location outside of the agricultural area, based at least in part on determined costs to relocate the topsoil, on determined costs to order and ship additional topsoil, and on the maximum allowable cost. For example, if the costs of relocating topsoil from each of the one or more excess locations to each of the one or more deficient locations exceeds the costs of ordering, shipping, and relocating additional topsoil to the one or more deficient locations, then it may be determined that ordering and shipping additional topsoil would be implemented in lieu of relocating topsoil from the one or more excess locations to the one or more deficient locations. In some cases, it may be determined that a combination of relocating topsoil and ordering/shipping/relocating additional topsoil would be implemented to maximize performance versus costs (e.g., relocating topsoil from excess locations that are proximate to any of the deficient locations, while ordering and shipping additional topsoil in lieu of relocating from excess locations that are far from any of the deficient locations and/or if there are insufficient amounts of topsoil at the excess locations, etc.). In some embodiments, determining the volume of topsoil to relocate from the one or more excess locations to the one or more deficient locations might be further based at least in part on one or more of soil physical composition, soil compaction, soil erodibility (which might be represented by an erosion index or erodibility index, or the like), soil chemical composition, surface tension, modeled flow rate, water capacity, 3-D mass haul optimization models (which might be based on one or more of these characteristics and/or based on the 3-D topographic survey(s) and the 3-D soil profile(s)), and/or the like.

At block 455, method 455 might comprise sending instructions to agricultural machinery or equipment (which might include, but are not limited to, one or more of earth-moving machines, tractors, plows, diggers, excavators, trucks, trailers, and/or other suitable machine or equipment that is configured to move a particular layer(s) of soil, dirt, rock, etc. from one location to another) to relocate the determined volume of topsoil from the one or more excess locations and/or from received shipments of additional (ordered and shipped) topsoil to the one or more deficient locations. In some cases, sending the instructions to relocate the determined volume of topsoil might include, without limitation, creating a guidance swath (or autopilot path or manual mode-assistance path) for each of the agricultural machinery or equipment (in some cases, within an array of similar agricultural machinery or equipment) to move from one position to another within the agricultural area, along with volume, length, width, and/or depth information, or the like, of which layers of soil to relocate to/from each identified location. In some instances, the guidance swath (or autopilot path or manual mode-assistance path) might include distance information and/or GPS or other location coordinates at one or more points along the path.

In the embodiments of FIGS. 3 and 4, methods 300 and 400 are described in terms of relocating topsoil directly from a source location (e.g., one or more excess locations or a transport vehicle delivering topsoil that has been ordered from a location outside the agricultural area, or the like) to a destination location (e.g., one or more deficient locations). The various embodiments, however, are not so limited, and deposit locations may be identified (in some cases, near the source location(s), near the destination location(s), and/or along the way between the source location(s) and any or a combination of destination location(s)). At these determined deposit locations, topsoil may be stockpiled for a time prior to relocation to the one or more deficient locations.

Figure 5A:
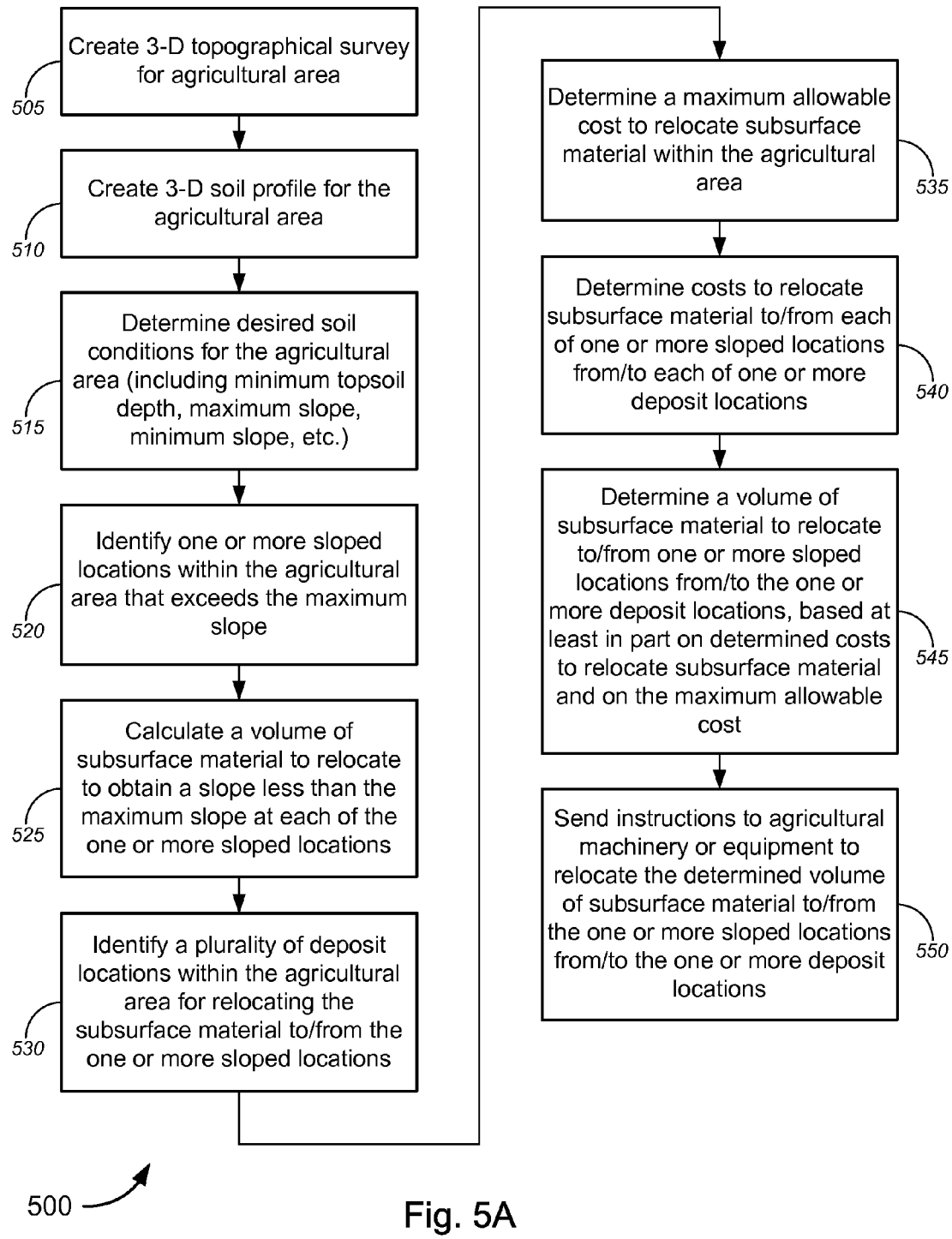
FIGS. 5A and 5B are flow diagrams illustrating various other methods for implementing mass haul optimization for agricultural terrain forming, based at least in part on three-dimensional soil modeling, in accordance with various embodiments.
Figure 5B:
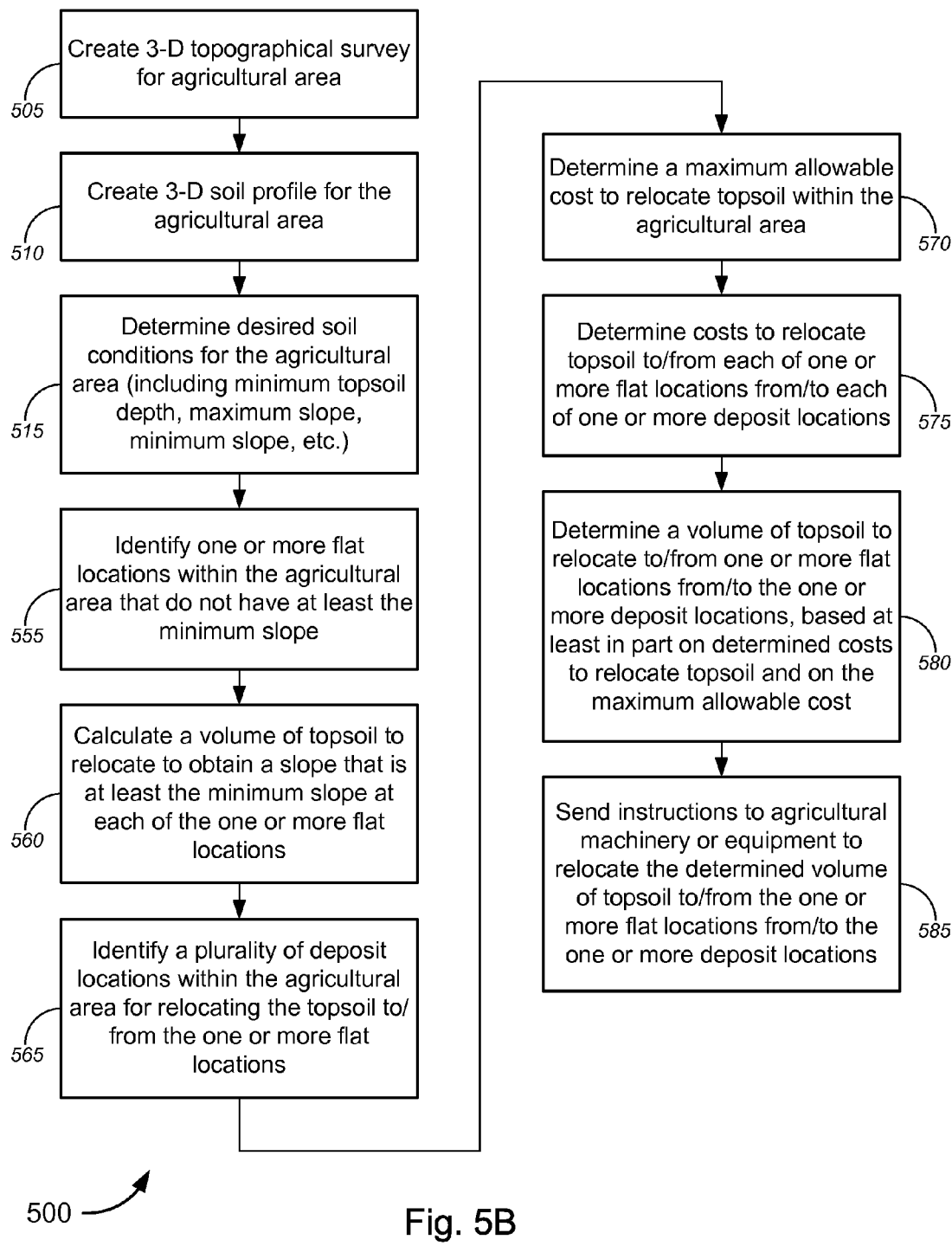

FIGS. 5A and 5B (collectively, "FIG. 5") are flow diagrams illustrating various other methods 500 for implementing mass haul optimization for agricultural terrain forming, based at least in part on three-dimensional soil modeling, in accordance with various embodiments. Method 500 of FIG. 5 is similar to method 300 of FIG. 3 and method 400 of FIG. 4, except that method 500 takes into consideration maximum slope (FIG. 5A) and minimum slope (FIG. 5B) of locations within the agricultural area.

While the techniques and procedures are depicted and/or described in a certain order for purposes of illustration, it should be appreciated that certain procedures may be reordered and/or omitted within the scope of various embodiments. Moreover, while the method illustrated by FIG. 5 can be implemented by or with (and, in some cases, are described below with respect to) the systems 100 and 200 of FIGS. 1 and 2, respectively (or components thereof), such methods may also be implemented using any suitable hardware implementation. Similarly, while each of the system 100 (and/or components thereof) of FIG. 1 or the system 200 (and/or components thereof) of FIG. 2 can operate according to the method illustrated by FIG. 5 (e.g., by executing instructions embodied on a computer readable medium), the systems 100 and 200 can each also operate according to other modes of operation and/or perform other suitable procedures.

In method 500 of FIG. 5, the processes at blocks 505-515 are similar to, if not identical to, the processes at blocks 305-315 of FIG. 3 or at blocks 405-415 of FIG. 4. Thus descriptions of the processes at blocks 305-315 or at blocks 405-415 similarly apply to the processes at blocks 505-515, and are omitted here to avoid excessive duplication. Here, the desired soil conditions might further include, without limitation, maximum slope and minimum slope. In some cases, the three-dimensional soil profile for the agricultural area might further comprise at least one of a depth to bedrock, a depth of subsurface material between the topsoil and the bedrock, interior elevation measurement points, or manual elevation measurement points.

With reference to the embodiment of FIG. 5A, method 500 might comprise identifying one or more sloped locations within the agricultural area that exceeds the maximum slope (block 520). If the slope of such locations exceed the maximum slope, tractors and other agricultural machinery that plant or harvest crops or otherwise maintain the agricultural area might tip over or otherwise endanger workers and/or damage equipment. At block 525, method 500 might comprise calculating a volume of subsurface material to relocate to obtain a slope that is less than the maximum slope (and greater than the minimum slope) at each of the one or more sloped locations. In some cases, that might involve removing subsurface material from at least one sloped location among the one or more sloped locations to achieve the desired slope (i.e., slope that is less than the maximum slope). In some instances, that might involve adding subsurface material (taken from other locations within the agricultural area or from a location(s) outside the agricultural area) to the existing subsurface material under the topsoil layer of at least one sloped location to achieve the desired slope (i.e., slope that is less than the maximum slope). In some cases, both of these alternative courses might be considered, with one course being more suitable for certain sloped locations with the other being more suitable for certain other sloped locations, where suitability might be determined based on costs, feasibility when the land is used for crops or other agricultural uses, flow of water, potential dangers to persons working or otherwise present in the agricultural area, and/or the like. In some embodiments, calculating the volume of subsurface material to relocate to obtain a slope that is less than the maximum slope (and greater than the minimum slope) at each of the one or more sloped locations might include applying a shrinkage factor to the volume of topsoil that is present at the one or more sloped locations before and after relocation of subsurface material to/from the one or more sloped locations.

Method 500, at block 530, might comprise identifying a plurality of deposit locations within the agricultural area (i.e., to stockpile the subsurface material) for relocating the subsurface material to/from the one or more sloped locations. Method 500 might further comprise determining a maximum allowable cost to relocate subsurface material within the agricultural area (block 535) and determining costs to relocate subsurface material to/from each of the one or more sloped locations from/to each of one or more deposit locations of the plurality of deposit locations (block 540). At block 545, method 500 might comprise determining a volume of subsurface material to relocate to/from one or more sloped locations from/to the one or more deposit locations, based at least in part on determined costs to relocate subsurface material and on the maximum allowable cost. In some embodiments, determining the volume of subsurface material to relocate to/from one or more sloped locations might be further based at least in part on one or more of soil physical composition, soil compaction, soil erodibility (which might be represented by an erosion index or erodibility index, or the like), soil chemical composition, surface tension, modeled flow rate, water capacity, 3-D mass haul optimization models (which might be based on one or more of these characteristics and/or based on the 3-D topographic survey(s) and the 3-D soil profile(s)), and/or the like.

Method 500 might further comprise, at block 550, sending instructions to agricultural machinery or equipment to relocate the determined volume of subsurface material to/from the one or more sloped locations from/to the one or more deposit locations. In some cases, sending the instructions to relocate the determined volume of subsurface material might include, without limitation, creating a guidance swath (or autopilot path or manual mode-assistance path) for each of the agricultural machinery or equipment (in some cases, within an array of similar agricultural machinery or equipment) to move from one position to another within the agricultural area, along with volume, length, width, and/or depth information, or the like, of which layers of soil to relocate to/from each identified location. In some instances, the guidance swath (or autopilot path or manual mode-assistance path) might include distance information and/or GPS or other location coordinates at one or more points along the path.

In operation, the deposit locations might allow for stockpiling of the subsurface material prior to relocation of the subsurface material to/from the one or more sloped locations. For example, a first type of agricultural machinery or equipment (e.g., a digging type tool) might be used to stockpile topsoil near the source of the subsurface material (whether one of the sloped locations, another location within the agricultural area, or the like), the same type of agricultural machinery or equipment (if not the actual same agricultural machinery or equipment) might be used to stockpile the calculated volume of subsurface material from the same location to another location nearby. In situations in which the subsurface material is obtained from a location outside the agricultural area, the subsurface material might be moved from a (road-based) transport vehicle to another (i.e., agriculture-based) transport vehicle to the deposit location.

A second type of agricultural machinery or equipment (e.g., a transport type vehicle, conveyor system, etc.) might be used to transport the subsurface material from the deposit location to another deposit location near the destination location (i.e., whether another location within the agricultural area, one of the sloped locations, another vehicle to transport to locations outside the agricultural area, or the like). At the destination location, the first type of agricultural machinery or equipment (if not the actual same agricultural machinery or equipment) might dig out and stockpile topsoil near the destination location, and might relocate the subsurface material from the nearby deposit location to the destination location. The first type of agricultural machinery or equipment might also put back the topsoil from the deposit locations to the source and destination locations, when the subsurface material have been relocated between the source and destination locations.

Turning to the embodiment of FIG. 5B, rather than (or in addition to) identifying the locations that exceed the maximum slope (at block 520), method 500 might comprise, at block 555, identifying one or more flat locations within the agricultural area that do not have at least the minimum slope. If the slope of such locations do not have at least the minimum slope, water might accumulate during periods of precipitation and/or irrigation, which might damage crops and/or might otherwise endanger workers and/or damage equipment. At block 560, method 500 might comprise calculating a volume of topsoil (and/or subsurface material) to relocate to obtain a slope that is at least the minimum slope at each of the one or more flat locations. Similar to the process with sloped locations, in some cases, that might involve removing topsoil (and in some cases, subsurface material as well) from at least one flat location among the one or more flat locations to achieve the desired slope (i.e., slope that is at least the minimum slope). In some instances, that might involve adding topsoil (and in some cases, subsurface material as well), which might be taken from other locations within the agricultural area or from a location(s) outside the agricultural area, to the existing topsoil (and/or subsurface material under the topsoil layer) of at least one flat location to achieve the desired slope (i.e., slope that is at least the minimum slope). In some cases, both of these alternative courses might be considered, with one course being more suitable for certain flat locations with the other being more suitable for certain other flat locations, where suitability might be determined based on costs, feasibility when the land is used for crops or other agricultural uses, flow of water, potential dangers to persons working or otherwise present in the agricultural area, 3-D mass haul optimization models (which might be based on one or more of these characteristics and/or based on the 3-D topographic survey(s) and the 3-D soil profile(s)), 3-D models of drainage system or drainage flows (that are based on the 3-D topographical survey(s) and/or the 3-D soil profile, etc.), and/or the like. In some embodiments, calculating the volume of topsoil needed to obtain a slope that is at least the minimum slope at each of the one or more flat locations might include applying a shrinkage factor to the volume of topsoil to add to the one or more deficient locations.

Method 500, at block 565, might comprise identifying a plurality of deposit locations within the agricultural area (i.e., to stockpile the topsoil and/or the subsurface material) for relocating the topsoil (and/or subsurface material) to/from the one or more flat locations. Method 500 might further comprise determining a maximum allowable cost to relocate topsoil (and/or subsurface material) within the agricultural area (block 570) and determining costs to relocate topsoil (and/or subsurface material) to/from each of the one or more flat locations from/to each of the one or more deposit locations of the plurality of deposit locations (block 575). At block 580, method 500 might comprise determining a volume of topsoil (and/or subsurface material) to relocate to/from one or more flat locations from/to the one or more deposit locations, based at least in part on determined costs to relocate topsoil (and/or subsurface material) and on the maximum allowable cost.

Method 500 might further comprise, at block 585, sending instructions to agricultural machinery or equipment to relocate the determined volume of topsoil (and/or subsurface material) to/from the one or more flat locations from/to the one or more deposit locations. In some cases, sending the instructions to relocate the determined volume of topsoil (and/or subsurface material) might include, without limitation, creating a guidance swath (or autopilot path or manual mode-assistance path) for each of the agricultural machinery or equipment (in some cases, within an array of similar agricultural machinery or equipment) to move from one position to another within the agricultural area, along with volume, length, width, and/or depth information, or the like, of which layers of soil to relocate to/from each identified location. In some instances, the guidance swath (or autopilot path or manual mode-assistance path) might include distance information and/or GPS or other location coordinates at one or more points along the path.

In operation, the deposit locations in the embodiment of FIG. 5B might be the similar to, if not identical to, the deposit locations in the embodiment of FIG. 5A, and might allow for stockpiling of the topsoil (and/or subsurface material) to/from the one or more flat locations. For example, a first type of agricultural machinery or equipment (e.g., a digging type tool) might be used to stockpile the calculated volume of topsoil near the source of the subsurface material (whether one of the flat locations, another location within the agricultural area, or the like). In situations in which the subsurface material is obtained from a location outside the agricultural area, the additional topsoil might be moved from a (road-based) transport vehicle to another (i.e., agriculture-based) transport vehicle to the deposit location.

A second type of agricultural machinery or equipment (e.g., a transport type vehicle, conveyor system, etc.) might be used to transport the topsoil from the deposit location to another deposit location near the destination location (i.e., whether another location within the agricultural area, one of the flat locations, another vehicle to transport to locations outside the agricultural area, or the like). At the destination location, the first type of agricultural machinery or equipment (if not the actual same agricultural machinery or equipment) might relocate the calculated volume of topsoil from the nearby deposit location to the destination location.

Although the processes of FIG. 5 do not expressly refer to determining costs of ordering, shipping, and relocating additional topsoil or subsurface material, such determination may be made in a manner similar to the corresponding or similar determinations in FIG. 4 (e.g., block 445), and the determinations at blocks 545 and/or 580 might be made, based at least in part on such cost determinations. The description of the embodiments of FIG. 5 above do refer to cases in which additional topsoil and/or subsurface material are received and relocated to particular deposit locations or to cases in which topsoil and/or subsurface material is removed from the sloped or flat locations and subsequently relocated to a location outside the agricultural area.

With reference to methods 300-500 of FIGS. 3-5, after the topsoil and/or subsurface material have been relocated from the one or more excess locations, to the one or more deficient locations, to/from the one or more sloped locations, or/or to/from the one or more flat locations, final soil compositions may be obtained at each of these locations, and changes to the model for determining the volume of topsoil and/or subsurface materials to/from each of these locations may be made in order to further optimize the model for improved future determinations of soil layer volumes for relocation.

Figure 6:
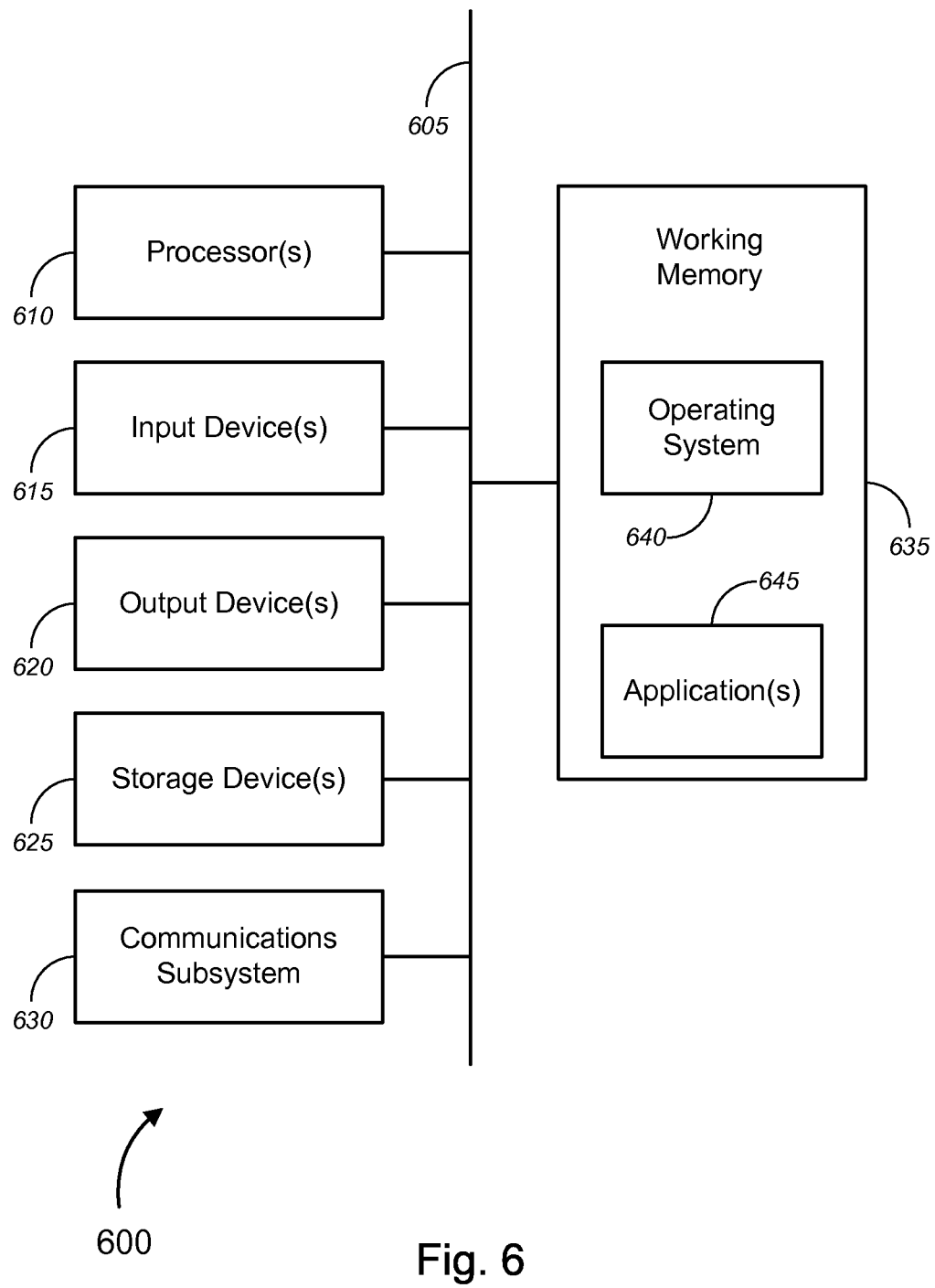
FIG. 6 is a block diagram illustrating an exemplary computer or system hardware architecture, in accordance with various embodiments.

FIG. 6 is a block diagram illustrating an exemplary computer or system hardware architecture, in accordance with various embodiments. FIG. 6 provides a schematic illustration of one embodiment of a computer system 600 of the system hardware that can perform the methods provided by various other embodiments, as described herein, and/or can perform the functions of computer or hardware system (i.e., host system) 115, 130, and/or 150, or of any other device (e.g., user device 105 or 110, survey equipment 135, and/or agricultural equipment or machinery 140 or 220, etc.), and/or the like, as described above. It should be noted that FIG. 6 is meant only to provide a generalized illustration of various components, of which one or more (or none) of each may be utilized as appropriate. FIG. 6, therefore, broadly illustrates how individual system elements may be implemented in a relatively separated or relatively more integrated manner.

The computer or hardware system 600—which might represent an embodiment of the computer or hardware system or host system 115, 130, and/or 150, or of any other device (e.g., user device 105 or 110, survey equipment 135, and/or agricultural equipment or machinery 140 or 220, etc.), described above with respect to FIGS. 1 and 2—is shown comprising hardware elements that can be electrically coupled via a bus 605 (or may otherwise be in communication, as appropriate). The hardware elements may include one or more processors 610, including, without limitation, one or more general-purpose processors and/or one or more special-purpose processors (such as digital signal processing chips, graphics acceleration processors, and/or the like); one or more input devices 615, which can include, without limitation, a mouse, a keyboard and/or the like; and one or more output devices 620, which can include, without limitation, a display device, a printer, and/or the like.

The computer or hardware system 600 may further include (and/or be in communication with) one or more storage devices 625, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable and/or the like. Such storage devices may be configured to implement any appropriate data stores, including, without limitation, various file systems, database structures, and/or the like.

The computer or hardware system 600 might also include a communications subsystem 630, which can include, without limitation, a modem, a network card (wireless or wired), an infra-red communication device, a wireless communication device and/or chipset (such as a Bluetooth™ device, an 802.11 device, a WiFi device, a WiMax device, a WWAN device, cellular communication facilities, etc.), and/or the like. The communications subsystem 630 may permit data to be exchanged with a network (such as the network described below, to name one example), with other computer or hardware systems, and/or with any other devices described herein. In many embodiments, the computer or hardware system 600 will further comprise a working memory 635, which can include a RAM or ROM device, as described above.

The computer or hardware system 600 also may comprise software elements, shown as being currently located within the working memory 635, including an operating system 640, device drivers, executable libraries, and/or other code, such as one or more application programs 645, which may comprise computer programs provided by various embodiments (including, without limitation, hypervisors, VMs, and the like), and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be encoded and/or stored on a non-transitory computer readable storage medium, such as the storage device(s) 625 described above. In some cases, the storage medium might be incorporated within a computer system, such as the system 600. In other embodiments, the storage medium might be separate from a computer system (i.e., a removable medium, such as a compact disc, etc.), and/or provided in an installation package, such that the storage medium can be used to program, configure and/or adapt a general purpose computer with the instructions/code stored thereon. These instructions might take the form of executable code, which is executable by the computer or hardware system 600 and/or might take the form of source and/or installable code, which, upon compilation and/or installation on the computer or hardware system 600 (e.g., using any of a variety of generally available compilers, installation programs, compression/decompression utilities, etc.) then takes the form of executable code.

It will be apparent to those skilled in the art that substantial variations may be made in accordance with specific requirements. For example, customized hardware (such as programmable logic controllers, field-programmable gate arrays, application-specific integrated circuits, and/or the like) might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer or hardware system (such as the computer or hardware system 600) to perform methods in accordance with various embodiments of the invention. According to a set of embodiments, some or all of the procedures of such methods are performed by the computer or hardware system 600 in response to processor 610 executing one or more sequences of one or more instructions (which might be incorporated into the operating system 640 and/or other code, such as an application program 645) contained in the working memory 635. Such instructions may be read into the working memory 635 from another computer readable medium, such as one or more of the storage device(s) 625. Merely by way of example, execution of the sequences of instructions contained in the working memory 635 might cause the processor(s) 610 to perform one or more procedures of the methods described herein.

The terms "machine readable medium" and "computer readable medium," as used herein, refer to any medium that participates in providing data that causes a machine to operate in a specific fashion. In an embodiment implemented using the computer or hardware system 600, various computer readable media might be involved in providing instructions/code to processor(s) 610 for execution and/or might be used to store and/or carry such instructions/code (e.g., as signals). In many implementations, a computer readable medium is a non-transitory, physical, and/or tangible storage medium. Such a medium may take many forms, including, but not limited to, non-volatile media, volatile media, and transmission media. Non-volatile media includes, for example, optical and/or magnetic disks, such as the storage device(s) 625. Volatile media includes, without limitation, dynamic memory, such as the working memory 635. Transmission media includes, without limitation, coaxial cables, copper wire and fiber optics, including the wires that comprise the bus 605, as well as the various components of the communication subsystem 630 (and/or the media by which the communications subsystem 630 provides communication with other devices). Hence, transmission media can also take the form of waves (including, without limitation, radio, acoustic and/or light waves, such as those generated during radio-wave and infra-red data communications).

Common forms of physical and/or tangible computer readable media include, for example, a floppy disk, a flexible disk, a hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read instructions and/or code.

Various forms of computer readable media may be involved in carrying one or more sequences of one or more instructions to the processor(s) 610 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer or hardware system 600. These signals, which might be in the form of electromagnetic signals, acoustic signals, optical signals, and/or the like, are all examples of carrier waves on which instructions can be encoded, in accordance with various embodiments of the invention.

The communications subsystem 630 (and/or components thereof) generally will receive the signals, and the bus 605 then might carry the signals (and/or the data, instructions, etc. carried by the signals) to the working memory 635, from which the processor(s) 605 retrieves and executes the instructions. The instructions received by the working memory 635 may optionally be stored on a storage device 625 either before or after execution by the processor(s) 610.

Figure 7:
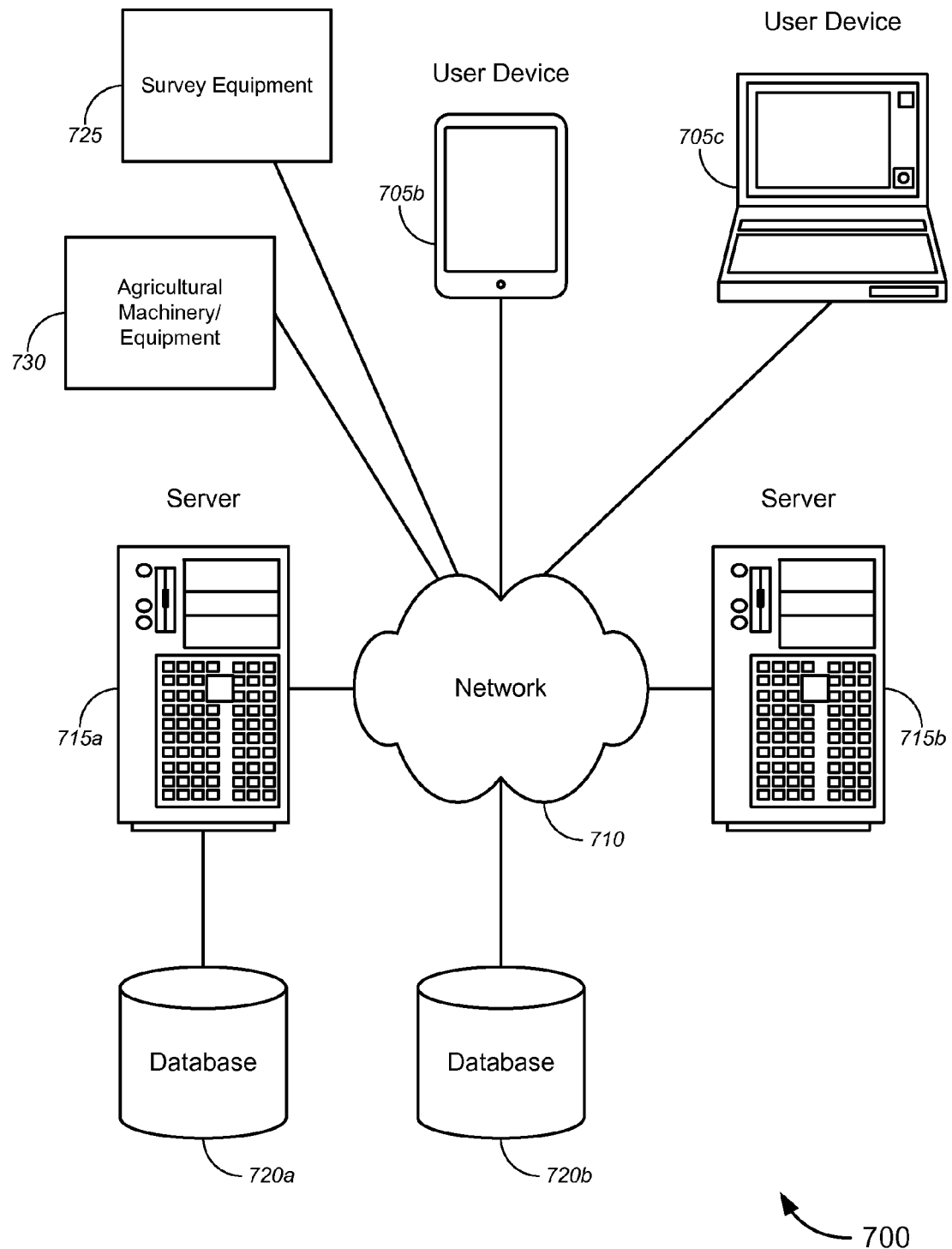
FIG. 7 is a block diagram illustrating a networked system of computers or computing systems, which can be used in accordance with various embodiments.

As noted above, a set of embodiments comprises methods and systems for implementing mass haul optimization for agricultural terrain forming, based at least in part on three-dimensional soil modeling. FIG. 7 illustrates a schematic diagram of a system 700 that can be used in accordance with one set of embodiments. The system 700 can include one or more user computers or user devices 705. A user computer or user device 705 can be a general purpose personal computer (including, merely by way of example, desktop computers, tablet computers, laptop computers, handheld computers, and the like, running any appropriate operating system, several of which are available from vendors such as Apple, Microsoft Corp., and the like), cloud computing devices, a server(s), and/or a workstation computer(s) running any of a variety of commercially-available UNIX™ or UNIX-like operating systems. A user computer or user device 705 can also have any of a variety of applications, including one or more applications configured to perform methods provided by various embodiments (as described above, for example), as well as one or more office applications, database client and/or server applications, and/or web browser applications. Alternatively, a user computer or user device 705 can be any other electronic device, such as a thin-client computer, Internet-enabled mobile telephone, and/or personal digital assistant, capable of communicating via a network (e.g., the network 710 described below) and/or of displaying and navigating web pages or other types of electronic documents. Although the exemplary system 700 is shown with three user computers or user devices 705, any number of user computers or user devices can be supported.

Certain embodiments operate in a networked environment, which can include a network 710. The network 710 can be any type of network familiar to those skilled in the art that can support data communications using any of a variety of commercially-available (and/or free or proprietary) protocols, including, without limitation, TCP/IP, SNA™, IPX™, AppleTalk™, and the like. Merely by way of example, the network 710 can include a local area network ("LAN"), including, without limitation, a fiber network, an Ethernet network, a Token-Ring™ network and/or the like; a wide-area network ("WAN"); a wireless wide area network ("WWAN"); a virtual network, such as a virtual private network ("VPN"); the Internet; an intranet; an extranet; a public switched telephone network ("PSTN"); an infra-red network; a wireless network, including, without limitation, a network operating under any of the IEEE 802.11 suite of protocols, the Bluetooth™ protocol known in the art, and/or any other wireless protocol; and/or any combination of these and/or other networks. In a particular embodiment, the network might include an access network of the service provider (e.g., an Internet service provider ("ISP")). In another embodiment, the network might include a core network of the service provider, and/or the Internet.

Embodiments can also include one or more server computers 715. Each of the server computers 715 may be configured with an operating system, including, without limitation, any of those discussed above, as well as any commercially (or freely) available server operating systems. Each of the servers 715 may also be running one or more applications, which can be configured to provide services to one or more clients 705 and/or other servers 715.

Merely by way of example, one of the servers 715 might be a data server, a web server, a cloud computing device(s), or the like, as described above. The data server might include (or be in communication with) a web server, which can be used, merely by way of example, to process requests for web pages or other electronic documents from user computers 705. The web server can also run a variety of server applications, including HTTP servers, FTP servers, CGI servers, database servers, Java servers, and the like. In some embodiments of the invention, the web server may be configured to serve web pages that can be operated within a web browser on one or more of the user computers 705 to perform methods of the invention.

The server computers 715, in some embodiments, might include one or more application servers, which can be configured with one or more applications accessible by a client running on one or more of the client computers 705 and/or other servers 715. Merely by way of example, the server(s) 715 can be one or more general purpose computers capable of executing programs or scripts in response to the user computers 705 and/or other servers 715, including, without limitation, web applications (which might, in some cases, be configured to perform methods provided by various embodiments). Merely by way of example, a web application can be implemented as one or more scripts or programs written in any suitable programming language, such as Java™, C, C#™ or C++, and/or any scripting language, such as Perl, Python, or TCL, as well as combinations of any programming and/or scripting languages. The application server(s) can also include database servers, including, without limitation, those commercially available from Oracle™, Microsoft™, Sybase™, IBM™, and the like, which can process requests from clients (including, depending on the configuration, dedicated database clients, API clients, web browsers, etc.) running on a user computer or user device 705 and/or another server 715. In some embodiments, an application server can perform one or more of the processes for implementing mass haul optimization for agricultural terrain forming, based at least in part on three-dimensional soil modeling, or the like, as described in detail above. Data provided by an application server may be formatted as one or more web pages (comprising HTML, JavaScript, etc., for example) and/or may be forwarded to a user computer 705 via a web server (as described above, for example). Similarly, a web server might receive web page requests and/or input data from a user computer 705 and/or forward the web page requests and/or input data to an application server. In some cases, a web server may be integrated with an application server.

In accordance with further embodiments, one or more servers 715 can function as a file server and/or can include one or more of the files (e.g., application code, data files, etc.) necessary to implement various disclosed methods, incorporated by an application running on a user computer 705 and/or another server 715. Alternatively, as those skilled in the art will appreciate, a file server can include all necessary files, allowing such an application to be invoked remotely by a user computer or user device 705 and/or server 715.

It should be noted that the functions described with respect to various servers herein (e.g., application server, database server, web server, file server, etc.) can be performed by a single server and/or a plurality of specialized servers, depending on implementation-specific needs and parameters.

In certain embodiments, the system can include one or more databases 720. The location of the database(s) 720 is discretionary: merely by way of example, a database 720a might reside on a storage medium local to (and/or resident in) a server 715a (and/or a user computer or user device 705). Alternatively, a database 720b can be remote from any or all of the computers 705, 715, so long as it can be in communication (e.g., via the network 710) with one or more of these. In a particular set of embodiments, a database 720 can reside in a storage-area network ("SAN") familiar to those skilled in the art. (Likewise, any necessary files for performing the functions attributed to the computers 705, 715 can be stored locally on the respective computer and/or remotely, as appropriate.) In one set of embodiments, the database 720 can be a relational database, such as an Oracle database, that is adapted to store, update, and retrieve data in response to SQL-formatted commands. The database might be controlled and/or maintained by a database server, as described above, for example.

In some embodiments, system 700 might further comprise survey equipment 725 (as described above with respect to FIGS. 1-5) that are in communication with server(s) 715 and/or user device(s) 705 over network 710. The survey equipment 725 might include, without limitation, at least one of air-based land survey equipment, land-based survey equipment, hand-held survey equipment, vehicle-based survey equipment, satellite-based land survey equipment, cameras, and/or the like. In some cases, system 700 might also comprise agricultural machinery and/or equipment 730, as described above with respect to FIGS. 1-5. The agricultural machinery and/or equipment 730 might include earth-moving machines, tractors, plows, diggers, excavators, trucks, trailers, and/or the like that are configured to move a particular layer(s) of soil, dirt, rock, etc. from one location to another.

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. A method of land forming for an agricultural area, the method comprising:
creating, with a first computer, a three-dimensional topographic survey for the agricultural area, the three-dimensional topographic survey comprising an outer boundary;
creating, with the first computer, a three-dimensional soil profile for the agricultural area, the three-dimensional soil profile comprising information about topsoil depth throughout the agricultural area within the outer boundary;
determining, with a second computer, desired soil conditions for the agricultural area, the desired soil conditions comprising a minimum topsoil depth for a plurality of locations within the agricultural area;
identifying, with the second computer, one or more deficient locations within the agricultural area that do not possess at least the minimum topsoil depth, based at least in part on the three-dimensional topographic survey and the three-dimensional soil profile;
calculating, with the second computer, a volume of additional topsoil needed to obtain at least the minimum topsoil depth at the one or more deficient locations;
identifying, with the second computer, a plurality of excess locations within the agricultural area that possess greater than the minimum topsoil depth, based at least in part on the three-dimensional topographic survey and the three-dimensional soil profile;
determining, with the second computer, a volume of topsoil to relocate from one or more excess locations of the plurality of excess locations to the one or more deficient locations, based at least in part on an optimization of costs of relocating the volume of topsoil from each of the one or more excess locations to the one or more deficient locations, said optimization is based on a distance between the one or more excess locations and the one or more deficient locations, wherein determining the volume of topsoil to relocate from the one or more excess locations to the one or more deficient locations comprises applying a bulking factor to a volume of topsoil removed from the one or more excess locations;
sending, via the second computer, to at least one earth moving machine, instructions to relocate the determined volume of topsoil from each of the one or more excess locations to the one or more deficient locations; and
relocating, with the at least one earth moving machine, at least part of the determined volume of topsoil from at least one of the one or more excess locations to a respective at least one of the one or more deficient locations, based on the instructions.

2. The method of claim 1, wherein the three-dimensional soil profile further comprises at least one of runoff coefficient, saturated hydraulic conductivity, consolidated soil composition, top-soil composition, or subsurface soil composition.

3. The method of claim 1, wherein the optimization of costs of relocating the volume of topsoil from each of the one or more excess locations to the one or more deficient locations is based at least in part on the distance between each of the one or more excess locations and the one or more deficient locations.

4. The method of claim 1, wherein the optimization of costs of relocating the volume of topsoil from each of the one or more excess locations to the one or more deficient locations is based at least in part on costs of relocating the volume of additional topsoil needed to obtain at least the minimum topsoil depth at the one or more deficient locations.

5. The method of claim 1, wherein the optimization of costs of relocating the volume of topsoil from each of the one or more excess locations to the one or more deficient locations is based at least in part on earth-moving equipment costs.

6. The method of claim 1, wherein the optimization of costs of relocating the volume of topsoil from each of the one or more excess locations to the one or more deficient locations is based at least in part on a cost of acquiring at least a portion of the volume of additional topsoil needed to obtain at least the minimum topsoil depth at the one or more deficient locations from a location outside of the agricultural area.

7. The method of claim 1, wherein calculating the volume of additional topsoil needed to obtain at least the minimum topsoil depth at the one or more deficient locations comprises applying, with the second computer, a shrinkage factor to the volume of additional topsoil to add to the one or more deficient locations.

8. The method of claim 1, further comprising:
identifying, with the second computer, a location to stockpile topsoil being relocated from the one or more excess locations to the one or more deficient locations, based at least in part on optimization of costs to stockpile topsoil.

9. The method of claim 1, further comprising:
determining, with the second computer, a maximum allowable cost to obtain at least the minimum topsoil depth throughout the agricultural area; and
wherein determining the volume of topsoil to relocate from the one or more excess locations to the one or more deficient locations comprises determining, with the second computer, a volume of topsoil to relocate from the one or more excess locations to the one or more deficient locations, based at least in part on the maximum allowable cost to obtain at least the minimum topsoil depth throughout the agricultural area.

10. The method of claim 1, wherein the three-dimensional soil profile for the agricultural area further comprises at least one of a depth to bedrock, a depth of subsurface material between the topsoil and the bedrock, interior elevation measurement points, or manual elevation measurement points.

11. The method of claim 10, wherein the desired soil conditions for the agricultural area further comprises a maximum slope; and wherein the method further comprises:
identifying, with the second computer, one or more sloped locations within the agricultural area that exceeds the maximum slope; and calculating, with the second computer, a volume of subsurface material to relocate to obtain a slope that is less than the maximum slope at each of the one or more sloped locations.

12. The method of claim 11, further comprising:
identifying, with the second computer, a location to stockpile the volume of subsurface material for relocating to or from each of the one or more sloped locations, based at least in part on the three-dimensional topographic survey and the three-dimensional soil profile.

13. The method of claim 11, further comprising:
identifying, with the second computer, a location to stockpile topsoil when the volume of subsurface material is relocated to or from each of the one or more sloped locations, based at least in part on the three-dimensional topographic survey and the three-dimensional soil profile.

14. The method of claim 11, wherein calculating the volume of subsurface material to relocate to obtain a slope that is less than the maximum slope at each of the one or more sloped locations comprises calculating, with the second computer, a volume of subsurface material to relocate to obtain a slope that is less than the maximum slope at each of the one or more sloped locations, based at least in part on an optimization of costs to relocate the volume of subsurface material.

15. The method of claim 10, wherein the desired soil conditions for the agricultural area further comprises a minimum slope; and wherein the method further comprises:
identifying, with the second computer, one or more flat locations within the agricultural area that do not have at least the minimum slope; and
calculating, with the second computer, a volume of topsoil to relocate to obtain a slope that is at least the minimum slope at each of the one or more flat locations.

16. The method of claim 15, further comprising:
identifying, with the second computer, a location to stockpile the volume of topsoil to relocate to obtain a slope that is at least the minimum slope at each of the one or more flat locations, based at least in part on the three-dimensional topographic survey and the three-dimensional soil profile.

17. The method of claim 15, wherein calculating the volume of topsoil needed to obtain a slope that is at least the minimum slope at each of the one or more flat locations comprises calculating, with the second computer, the volume of topsoil needed to obtain a slope that is at least the minimum slope at each of the one or more flat locations, based at least in part on an optimization of costs of acquiring a volume of supplemental topsoil needed to obtain a slope that is at least the minimum slope at the one or more flat locations from a location outside of the agricultural area.

18. The method of claim 17, wherein calculating the volume of topsoil needed to obtain a slope that is at least the minimum slope at each of the one or more flat locations further comprises applying, with the second computer, a shrinkage factor to the volume of supplemental topsoil to add to the one or more deficient locations.

19. The method of claim 1, wherein the first computer and the second computer are the same computer.

20. A non-transitory computer readable medium in communication with one or more processors, the non-transitory computer readable medium having encoded thereon a set of instructions executable by the one or more processors to perform one or more operations, comprising:
creating a three-dimensional topographic survey for the agricultural area that comprises an outer boundary;
creating a three-dimensional soil profile for the agricultural area that comprises information about topsoil depth throughout the agricultural area within the outer boundary;
determining desired soil conditions for the agricultural area that comprise a minimum topsoil depth for a plurality of locations within the agricultural area;
identifying one or more deficient locations within the agricultural area that do not possess at least the minimum topsoil depth, based at least in part on the three-dimensional topographic survey and the three-dimensional soil profile;
calculating a volume of additional topsoil needed to obtain at least the minimum topsoil depth at the one or more deficient locations;
identifying a plurality of excess locations within the agricultural area that possess greater than the minimum topsoil depth, based at least in part on the three-dimensional topographic survey and the three-dimensional soil profile;
determining a volume of topsoil to relocate from one or more excess locations of the plurality of excess locations to the one or more deficient locations, based at least in part on an optimization of costs of relocating the volume of topsoil from each of the one or more excess locations to the one or more deficient locations, said optimization is based on a distance between the one or more excess locations and the one or more deficient locations, wherein determining the volume of topsoil to relocate from the one or more excess locations to the one or more deficient locations comprises applying a bulking factor to a volume of topsoil removed from the one or more excess locations; and
causing an at least one earth moving machine to relocate at least part of the determined volume of topsoil from at least one of the one or more excess locations to at least one of the one or more deficient locations,
wherein causing the at least one earth moving machine to relocate at least part of the determined volume of topsoil includes sending instructions to the at least one earth moving machine to relocate the determined volume of topsoil.

* * * * *